US012685140B2

(12) United States Patent
Kuo et al.

(10) Patent No.: US 12,685,140 B2
(45) Date of Patent: Jul. 14, 2026

(54) CONTACT ARRANGEMENTS FOR DEEP TRENCH CAPACITORS

(71) Applicant: Taiwan Semiconductor Manufacturing Company, Ltd., Hsinchu (TW)

(72) Inventors: Fu-Chiang Kuo, Hsinchu City (TW); Meei-Shiou Chern, Hsinchu County (TW); Jyun-Ting Hou, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 551 days.

(21) Appl. No.: 18/169,600

(22) Filed: Feb. 15, 2023

(65) Prior Publication Data

US 2023/0369213 A1 Nov. 16, 2023

Related U.S. Application Data

(60) Provisional application No. 63/409,042, filed on Sep. 22, 2022, provisional application No. 63/342,263, filed on May 16, 2022.

(51) Int. Cl.
| | |
|---|---|
| *H01L 23/528* | (2006.01) |
| *H01L 21/768* | (2006.01) |
| *H01L 23/522* | (2006.01) |
| *H10D 1/66* | (2025.01) |

(52) U.S. Cl.
CPC .... *H01L 23/5283* (2013.01); *H01L 21/76877* (2013.01); *H01L 21/76898* (2013.01); *H01L 23/5226* (2013.01); *H10D 1/665* (2025.01)

(58) Field of Classification Search
CPC . H10D 1/665; H01L 23/5226; H01L 23/5223; H01L 23/5283; H01L 21/76877; H01L 21/76898
See application file for complete search history.

(56) References Cited

U.S. PATENT DOCUMENTS

| | | | | |
|---|---|---|---|---|
| 10,546,917 | B1 * | 1/2020 | Tsai | H10D 1/042 |
| 2010/0181645 | A1 * | 7/2010 | Marenco | H10D 84/212 |
| | | | | 257/532 |

(Continued)

FOREIGN PATENT DOCUMENTS

| | | |
|---|---|---|
| TW | 201913889 | 4/2019 |

*Primary Examiner* — John M Parker

(74) *Attorney, Agent, or Firm* — Foley & Lardner LLP

(57) ABSTRACT

A semiconductor device includes a substrate including a first trench that extends along a first lateral direction and a second trench that extends along a second lateral direction; a first metal layer filling each of the first and second trenches; a second metal layer filling each of the first and second trenches, and disposed above and electrically isolated from the first metal layer; a first via structure in electrical contact the with first metal layer; and a second via structure in electrical contact with the second metal layer. When viewed from the top, the first via structure and the second via structure are interposed between the first trench and the second trench along the first lateral direction. The first via structure and the second via structure are disposed immediately adjacent to each other along the second lateral direction.

20 Claims, 22 Drawing Sheets

(56) References Cited

U.S. PATENT DOCUMENTS

| | | | |
|---|---|---|---|
| 2013/0161792 A1* | 6/2013 | Tran | H10D 1/62 |
| | | | 438/386 |
| 2019/0074349 A1* | 3/2019 | Lin | H01L 21/31053 |
| 2021/0343881 A1 | 11/2021 | Cheng | |

* cited by examiner

CONTACT ARRANGEMENTS FOR DEEP TRENCH CAPACITORS

CROSS-REFERENCE TO RELATED APPLICATION

This application claims priority to and the benefit of U.S. Provisional Patent App. No. 63/342,263, filed May 16, 2022, and U.S. Provisional Patent App. No. 63/409,042, filed Sep. 22, 2022, both of which are incorporated herein by reference in their entireties for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
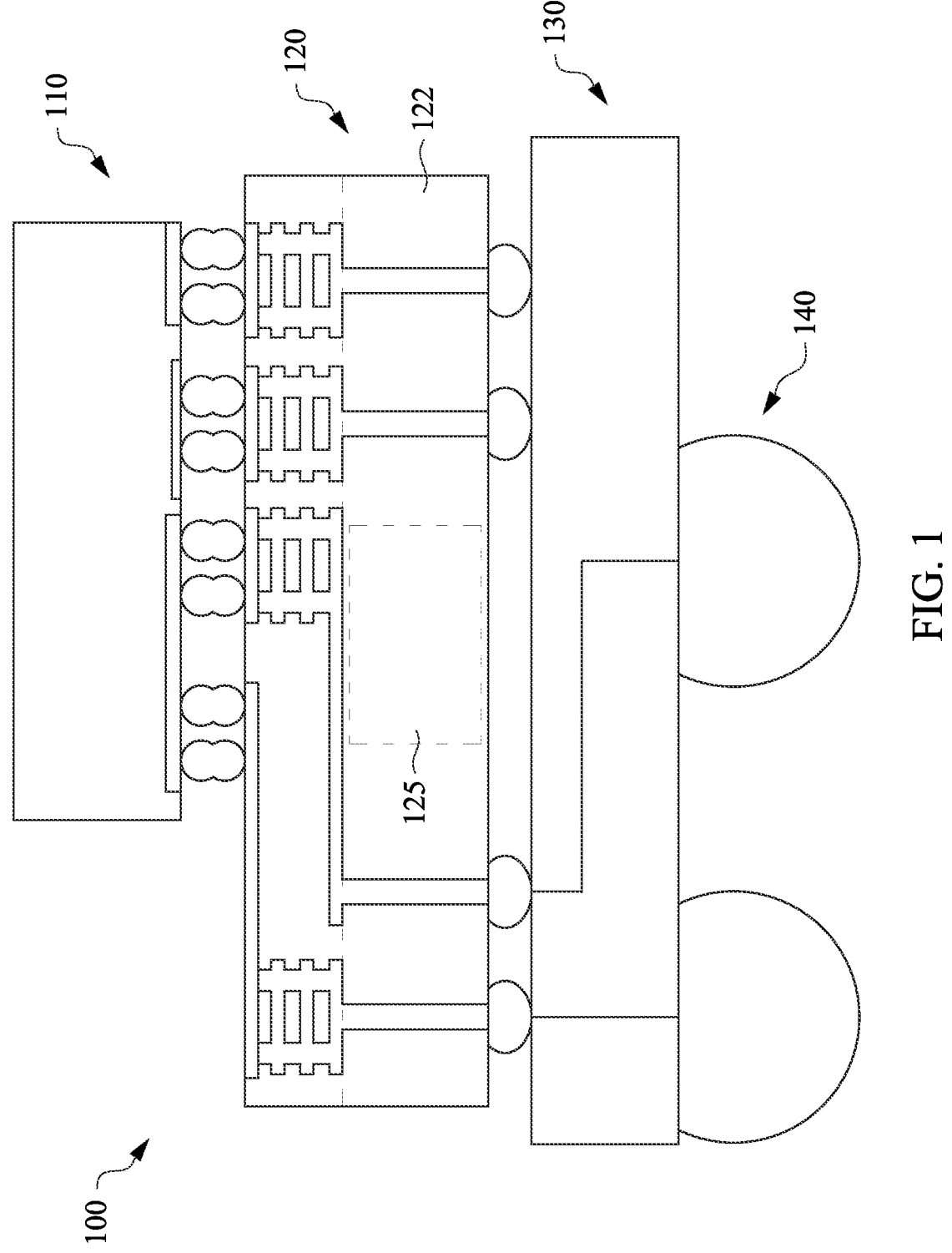
FIG. 1 illustrates a cross-sectional view of an example semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic equipment using semiconductor devices are essential for many modern applications. With the advancement of electronic technology, the semiconductor devices are becoming increasingly smaller in size while having greater functionality and greater amounts of integrated circuitry. Further, due to the miniaturized scale of the semiconductor device, various technologies (e.g., a chip on wafer on substrate (CoWoS), a three-dimensional integrated circuit (3DIC), etc.) are utilized to integrate several chips into a single semiconductor package. In such a semiconductor package, a number of chips or dies are arranged or otherwise assembled side-by-side or on top of one another.

As several chips are integrated together, an interposer can be formed below the chips and can include routing of signals and power supply lines for the chips that are connected to one another. A number of through silicon via (TSV) structures can be formed within the interposer to enable the formation of connection lines between chips as well as power supply lines (VDD, VSS, etc.). The TSV structures are then exposed on the opposite side of the interposer and bonded to a package substrate (e.g., a printed circuit board (PCB)).

Within the interposer, one or more deep trench capacitors (DTCs) may be formed to help remove noise and provide stable voltages. In general, the DTC can be formed of a number of trenches in an interposer substrate that are each filled with a number of meal layers. The trenches may be arranged as a number of trench arrays, and the metal layers within each trench can be stacked on top of one another. To operate these metal layers as a capacitor, each of the metal layers is connected to a corresponding voltage (e.g., VDD or VSS) through a number of via structures. In exiting technologies, the via structures connected to the same metal layer across one or more different trench arrays may be arranged along a single space (e.g., alley) over the interposer substrate. For example, when there are four metal layers in each of the trenches, it is necessary to spare at least four alleys on the substrate, which can disadvantageously consume a significant amount of previous real estate. Thus, the existing DTCs have not been entirely satisfactory in many aspects.

In the present disclosure, a novel design of DTC and its connection structures can provide several advantages over the current technology. In various embodiments, the DTC can be constituted by a number of trench arrays, a first subset of which extend along a first lateral direction and a second subset of which extend along a second lateral direction. The first subset of trenches and the second subset of trenches can be laterally arranged with each other as a checkboard pattern. Within each of the first and second subsets of trenches, a number of electrically isolated metal layers are stacked on top of one another. Further, a number of via groups can be laterally disposed between adjacent ones of the trenches (e.g., between a corresponding one of the first subset of trenches and a corresponding one of the second subset of trenches). Each via group can include a number of via structures corresponding to the number of the meal layers, and further, the via structures in each via group can be arranged laterally close to each other. For example, the via structures of each via group may be arranged over a single staircase structure. Stated another way, the via structures can have respectively different heights but are laterally spaced from one another with a stair width. Based on such structures, a significant amount of real estate on a corresponding substrate can be spared, which can advantageously allow a total area of the disclosed DTC to be further shrunk. As such, a capacitance value per unit area of the disclosed DTC can be significantly higher than the existing DTCs.

FIG. 1 illustrates a cross-sectional view of an example semiconductor package 100 that includes a number of integrated semiconductor chips, in accordance with some embodiments. For example, the semiconductor package 100 may include a number of integrated circuit (IC) chips 110, an interposer 120, a package substrate 130, and a number of bump structures 140. The semiconductor package 100 may be implemented as any of various packages to include a number of operatively coupled chips. Such examples packages include, but are not limited to, quad flat packages (QFP), pin grid array (PGA) packages, ball grid array (BGA) packages, flip chips (FC), three-dimensional integrated circuits (3DICs), wafer level packages (WLPs), package on package (PoP) devices, chip on wafer on substrate (CoWoS) packages, etc.

The chips 110 may each include any kind of semiconductor chips. For example, the chip 110 may include a microprocessor, a memory device (e.g., dynamic random access memory (DRAM)), a field programmable gate array (FPGA), a system-on-chip (SOC), etc. Although only one chip 110 is shown in the illustrated embodiment of FIG. 1, it should be understood that the semiconductor package 100 may include any number of chips 110 while remaining within the scope of the present disclosure. The chips 110 may be operatively (e.g., electrically) coupled to one another using interconnect layers formed in the interposer 120. The interposer 120 may be bonded to the chips 110. In the interposer 120, such interconnection layers may be formed over a semiconductor substrate (sometimes referred to as an interposer substrate) 122 formed of silicon, germanium, gallium, arsenic, Si—Ge, any other suitable semiconductor material or combination thereof. The package substrate 130 may include a package substrate on which the interposer 120 is bonded. The package substrate (e.g., a printed circuit board (PCB)) can help propagate electrical signals (e.g., power) received from the bump structures 140 to the chips 110.

In various embodiments of the present disclosure, the interposer 120 can include a number of trenches extending into the substrate 122. These trenches can each be filled with a number of metal layers so as to form a capacitor 125 (sometimes referred to as a deep trench capacitor). The metal layers may be electrically isolated from one another, and (e.g., electrically and physically) connected to different via structures of a corresponding one of plural via groups, respectively. Such via structures of each via group may be laterally disposed immediately next to one another, which allows the capacitor 125 to be formed within a relatively limited area while maintaining its relatively high capacitance value. Details of arrangements of the via structures/via groups of the disclosed capacitor will be discussed below.

The capacitor 125 can be utilized for myriad of purposes on the package 100. For example, the capacitor 125 may be configured as a decoupling capacitor used to decouple one part of an electrical circuit, such as interconnect, from another part of the circuit. In another example, the capacitor 125 may be a part of an integrated passive device (IPD), an integrated voltage regulator (IVR), or the like. By including such a capacitor, noise arising from the interconnect can be shunted through the capacitor 125 to reduce the effects of interconnect noise on the remainder of the circuit.

Figure 2:
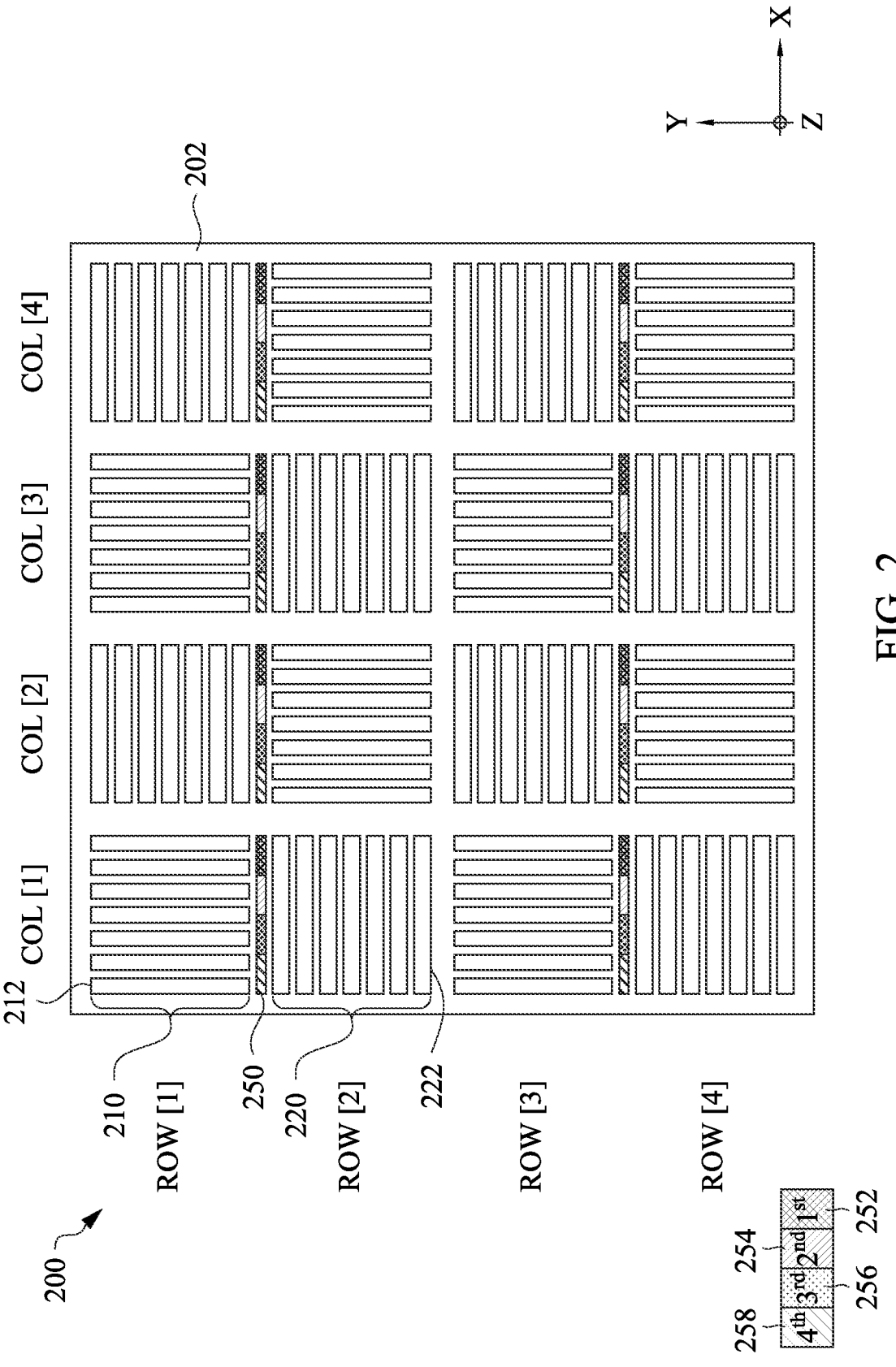
FIG. 2 illustrates a top view of an example implementation of a capacitor of the semiconductor package of FIG. 1, in accordance with some embodiments.

FIG. 2 illustrates a top view of one example implementation 200 of the capacitor 125 (FIG. 1), in accordance with various embodiments. It should be understood that the implementation 200 is simplified for illustrative purposes. Further, the implementation 200 is not limited to being used for the capacitor of a semiconductor package. For example, the implementation 200 can be utilized to form a capacitor included in any kind of semiconductor devices, while remaining within the scope of the present disclosure. Herein, the implementation 200 may sometimes referred be referred to as capacitor 200.

As shown, the capacitor 200 includes a number of first trench arrays 210 and a number of second trench arrays 220 formed in a substrate 202 (e.g., an interposer substrate). The first trench arrays 210 each include a number of trenches 212 extending in a first lateral direction (e.g., the Y direction); and the second trench array 220 each include a number of trenches 222 extending in a second lateral direction perpendicular to the first lateral direction (e.g., the X direction). The trench arrays 210 and 220 are arranged in a column-row configuration. As shown, the capacitor 200 has the trench arrays 210 and 220 arranged across four columns, COL[1], COL[2], COL[3], and COL[4], and four rows, ROW[1], ROW[2], ROW[3], and ROW[4]. Further, the different trench arrays 210 and 220 may be arranged to form a checkboard pattern. For example in FIG. 2, along any of the rows, the trench arrays 210 and 220 are alternately arranged, and along any of the columns, the trench arrays 210 and 220 are alternately arranged.

Figure 3:
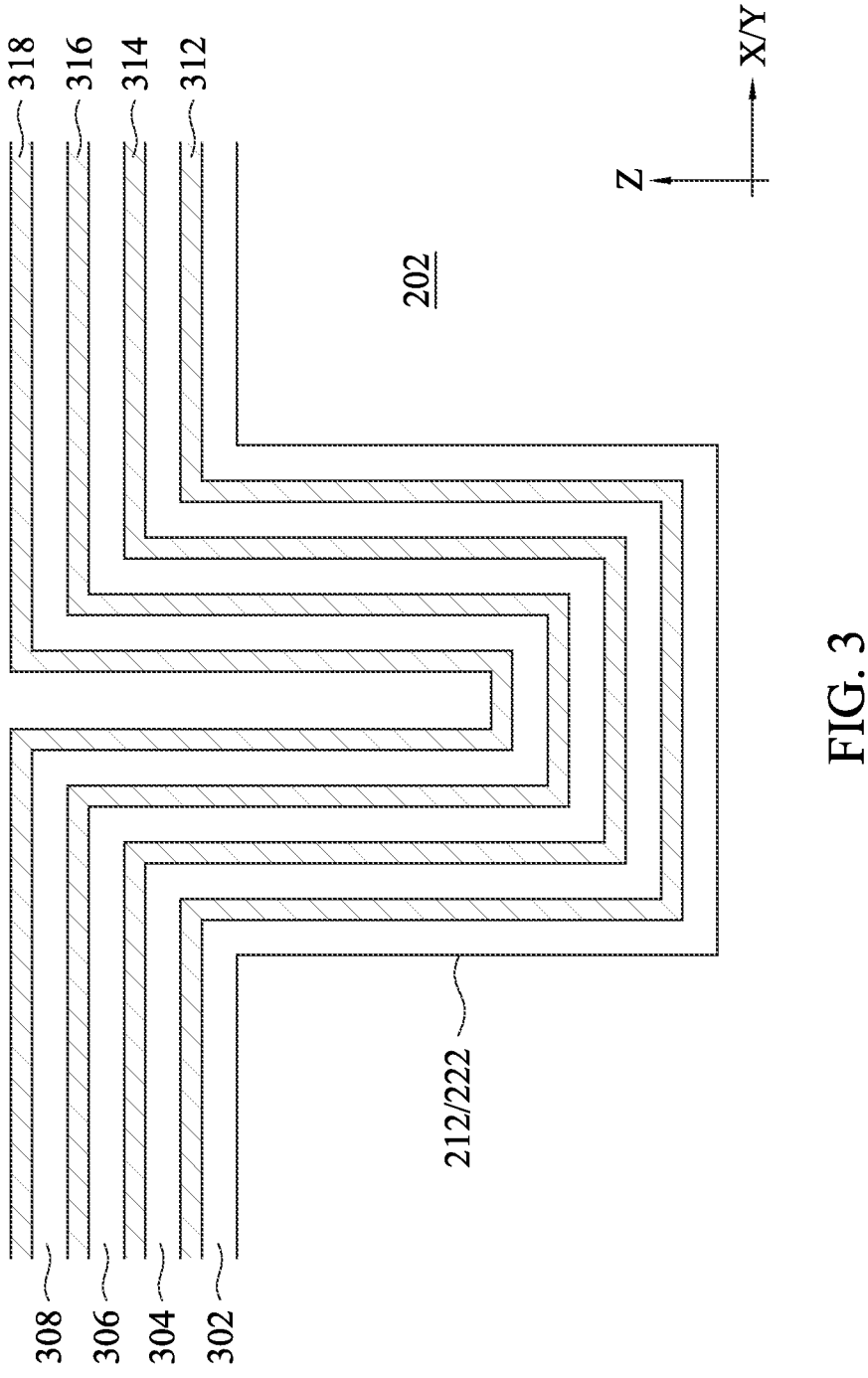
FIG. 3 illustrates a cross-sectional view of a portion of the capacitor of FIG. 2, in accordance with some embodiments.

Each of the trenches 212/222 may extend into the substrate 202 with a certain depth, and be filled with a number of metal layers. FIG. 3 illustrates a cross-sectional view of one of the trenches 212/222. Specifically, the cross-sectional view of FIG. 3 may be cut along a direction perpendicular to a lengthwise direction of the trench 212/222. For example, the cross-sectional view of FIG. 3 may be cut along the X direction for a trench 212, and may be cut along the Y direction for a trench 222. The cross-sectional view of FIG. 3 is simplified for illustrative purposes, and thus each trench 212/222 can be filled with any of various other layers, while remaining within the scope of the present disclosure.

In the example of FIG. 3, the trench 212/222 is filled with four metal layers 302, 304, 306, and 308 (each, e.g., formed of one or more metal materials such as, titanium nitride, titanium, tantalum nitride, tantalum, copper, aluminum, etc.). The metal layers 302 to 308 are stacked on top of one another, with adjacent ones of the metal layers separated (or otherwise isolated) by a corresponding one of dielectric layers 312, 314, 316, and 318 (each, e.g., formed of a dielectric material such as, a high-k dielectric, etc.). For example, the metal layers 302 and 304 are separated by the dielectric layer 312; the metal layers 304 and 306 are separated by the dielectric layer 314; and the metal layers 306 and 308 are separated by the dielectric layer 316. In some embodiments, the metal layers 302 to 308 may each have a thickness from about 100 angstroms to about 300 angstroms, and the dielectric layers 312 to 318 may each have a thickness from about 1 angstrom to about 200 angstrom. It should be noted that each of the metal layers can further extend along a top surface of the substrate 202 to allow one or more corresponding via structures to land thereon, which will be discussed in further detail below.

Referring again to FIG. 2, the capacitor 200 includes a number of via groups 250, and each of the via groups 250 includes a number of via structures 252, 254, 256, and 258 connected to metal layers 302, 304, 306, and 308, respectively, in accordance with various embodiments. As shown in the example implementation of FIG. 2, each via group 250 may be disposed between a corresponding pair of first trench array 210 and second trench array 220 along a corresponding column (e.g., the Y direction). Further, two of the rows (along each column) may share a corresponding via group 250. For example, the trench array 210 at the intersection of COL[1] and ROW[1] and the trench array 220 at the intersection of COL[1] and ROW[2] may share one via group 250, while no via group 250 is present along the side of any of these two different trench arrays. As such, the space between any adjacent columns can be spared.

Figure 4:
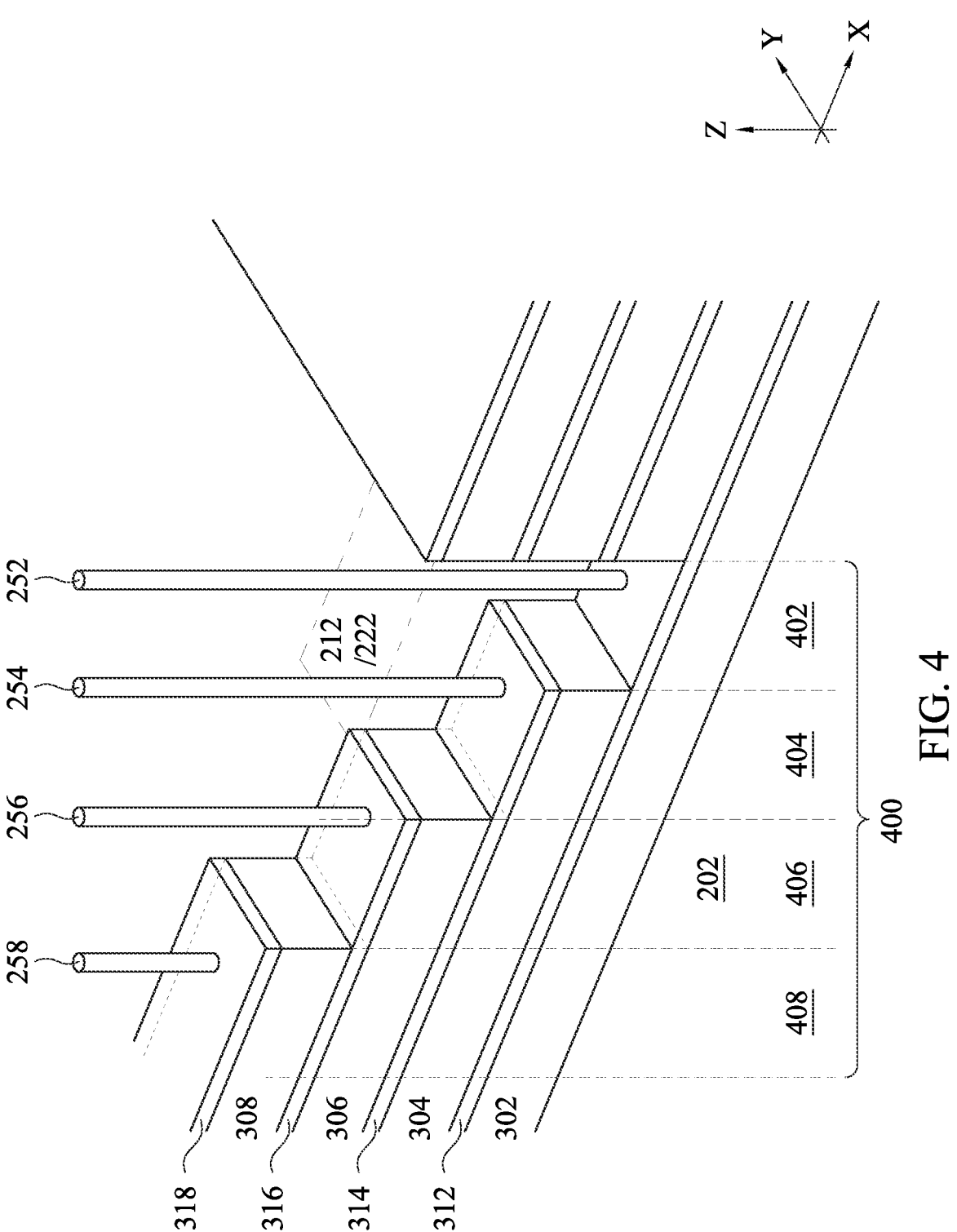
FIG. 4 illustrates a perspective view of a portion of the capacitor of FIG. 2, in accordance with some embodiments.

In various embodiments, the via structures 252 to 258 of each via group 250, disposed immediately next to one another along a lateral direction (e.g., the X direction in FIG. 2), can be in (e.g., physical and/or electrical) contact with different metal layers 302 to 308, respectively. FIG. 4 illustrates a perspective view of the via structures 252 to 258 of one via group 250, and FIG. 5 illustrates a cross-sectional view of these via structures 252 to 258 cut along a direction in which the via structures 252 to 258 are laterally arranged.

Figure 5:
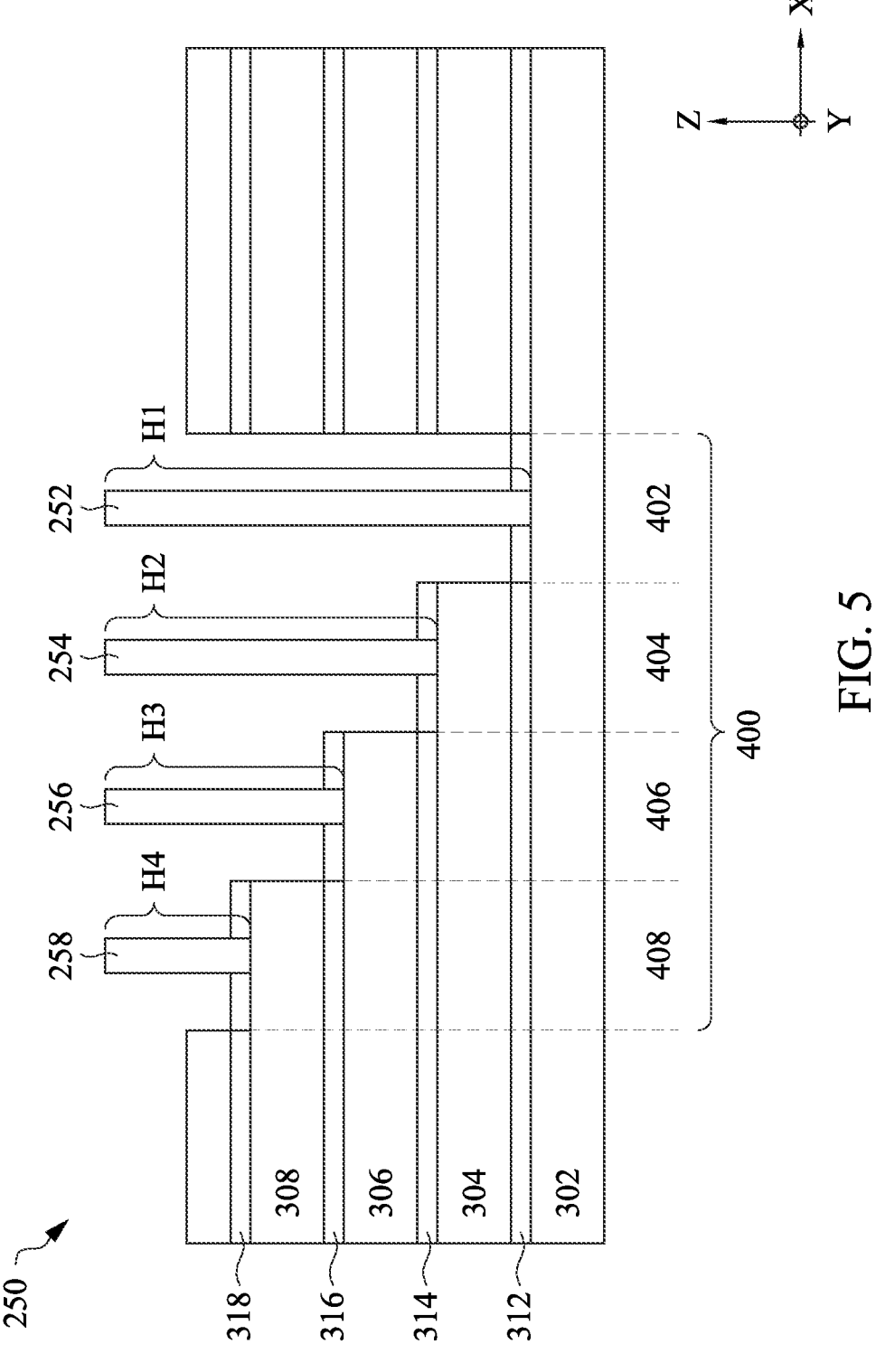
FIG. 5 illustrates a cross-sectional view of a portion of the capacitor of FIG. 2, in accordance with some embodiments.

As shown in FIGS. 4-5, the via structures 252 to 258 are formed to connect to portions of the metal layers 302 to 308 that are disposed over the top surface of the substrate 202, respectively. Further, the respective portions of the metal layers 302 to 308 over the top surface of the substrate 202 are patterned to form a staircase 400 laterally next to but vertically above the corresponding trench arrays 210 and 220. The staircase 400 has a number of stairs, 402, 404, 406, and 408, corresponding to the number of metal layers, e.g., 4 in the example of FIG. 4. Further, such a staircase 400 may extend (e.g., climb up or down) along the X direction.

Specifically in FIG. 5, the via structure 252 extends with a first height ($H_1$) to be in contact with first stair (or trench) 402 formed by etching respective portions of the metal layers 308, 306, and 304 above the dielectric layer 312; the via structure 254 extends with a second height ($H_2$) to be in contact with second stair (or trench) 404 formed by etching respective portions of the metal layers 308 and 306 above the dielectric layer 314; the via structure 256 extends with a third height ($H_3$) to be in contact with third stair (or trench) 406 formed by etching a respective portion of the metal layer 308 above the dielectric layer 316; and the via structure 258 extends with a fourth height ($H_4$) to be in contact with fourth stair (or trench) 408 formed by etching a respective portion of a dielectric protection layer above the dielectric layer 318. Alternatively stated, the via structures 252 to 258 can have their respective top surfaces coplanar with one another, and each of the via structures 252 to 258 can (e.g., downwardly) extend toward the substrate with a corresponding height to be in contact with a corresponding metal layer. As such, the first height ($H_1$) to the fourth height ($H_4$) are each measured from their coplanar top surfaces to its bottom surface (i.e., the top surface of a contacted metal layer). Each of the stairs 402 to 408 has a respective stair width (e.g., in the X direction) and a stair height (e.g., in the Z direction). The stair height may be determined according to the thickness of the metal layers and the thickness of the dielectric layers. In some embodiments, the staircase 400 has each of its stairs elevated from an immediately lower stair with the stair height. As such, the heights $H_1$ to $H_4$ can be monotonously decreased.

In various embodiments, the via structures 252 to 258 across different via groups 250 can be coupled to each other through a number of metal routings (each, e.g., formed of one or more metal materials such as, copper, aluminum, etc.). Theses metal routings may be disposed in one of a number of metallization layers (e.g., M1 layer) formed above the substrate 202. In various embodiments, the via structures, connected to even numbered metal layers (e.g., the second layer 304 and the fourth layer 308), are coupled to each other through one or more first metal routings, while the via structures, connected to odd numbered metal layers (e.g., the first layer 302 and the third layer 306), are coupled to each other through one or more second metal routings. The first metal routings and second metal routing may be electrically coupled to a first supply voltage and a second supply voltage, respectively. As such, the odd numbered metal layers and the even numbered metal layers can operatively function as the first electrode and the second electrode of a corresponding capacitor (e.g., 125), respectively.

Figures 6, 7:
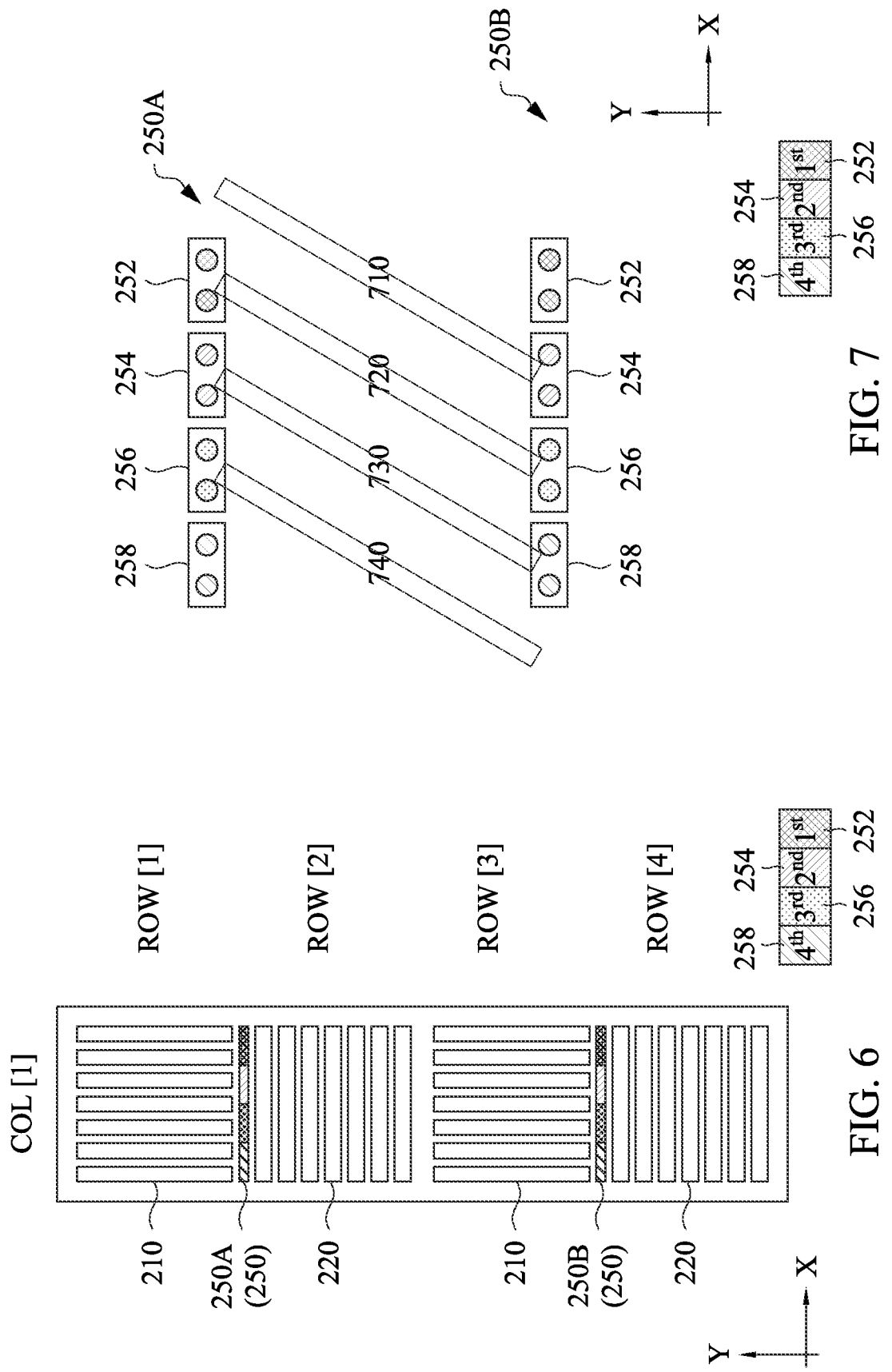
FIG. 6 illustrates a top view of a portion of the implementation of FIG. 2, in accordance with some embodiments.
FIG. 7 illustrates a top view of a portion of the implementation of FIG. 2, in accordance with some embodiments.

With such an arrangement of the via groups 250 shown in the implementation 200 of FIG. 2, the first and second metal routings may be tilted from the X direction or the Y direction. FIG. 6 reproduces a portion of the implementation 200, e.g., four trench arrays 210 and 220 in one of the columns (COL[1]) across four of the rows (ROW[1] to ROW[4]), in which two trench arrays 210 and 220 share a common via group 250. The via groups 250 interposed between ROW[1] and ROW[2] and between ROW[3] and ROW[4] are herein referred to as via group 250A and via group 250B, respectively. FIG. 7 illustrates a top view of the reproduced implementation shown in FIG. 6, in which a number of metal routings 710, 720, 730, and 740 are shown.

As shown in FIG. 7, each of the via groups 250A and 250B includes a number (e.g., 2) of each of the via structures 252 to 258. To connect the via structures 252 of via group 250A (in contact with the first metal layer 302) to the via structures 256 of via group 250B (in contact with the third metal layer 306), the metal routing 720 is tilted from the X direction or the Y direction by a certain angle. To connect the via structures 254 of via group 250A (in contact with the second metal layer 304) to the via structures 258 of via group 250B (in contact with the fourth metal layer 308), the metal routing 730 is tilted from the X direction or the Y direction by about the same angle. Similarly, the metal routing 710 can be tilted with about the same angle to connect the via structures 254 of via group 250B (in contact with the second metal layer 304) to the via structures 258 of another via group (in contact with the fourth metal layer 308); and the metal routing 740 can be tilted with about the same angle to connect the via structures 256 of via group 250A (in contact with the third metal layer 306) to the via structures 252 of yet another via group (in contact with the first metal layer 302). As such, the metal routings 710 to 740 are arranged in parallel with each other.

As a non-limiting example, the via groups 250A and 250B (of FIGS. 6-7) may be spaced from each other along the Y direction by a distance that is about 6 micrometers to about 7 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figures 8, 9:
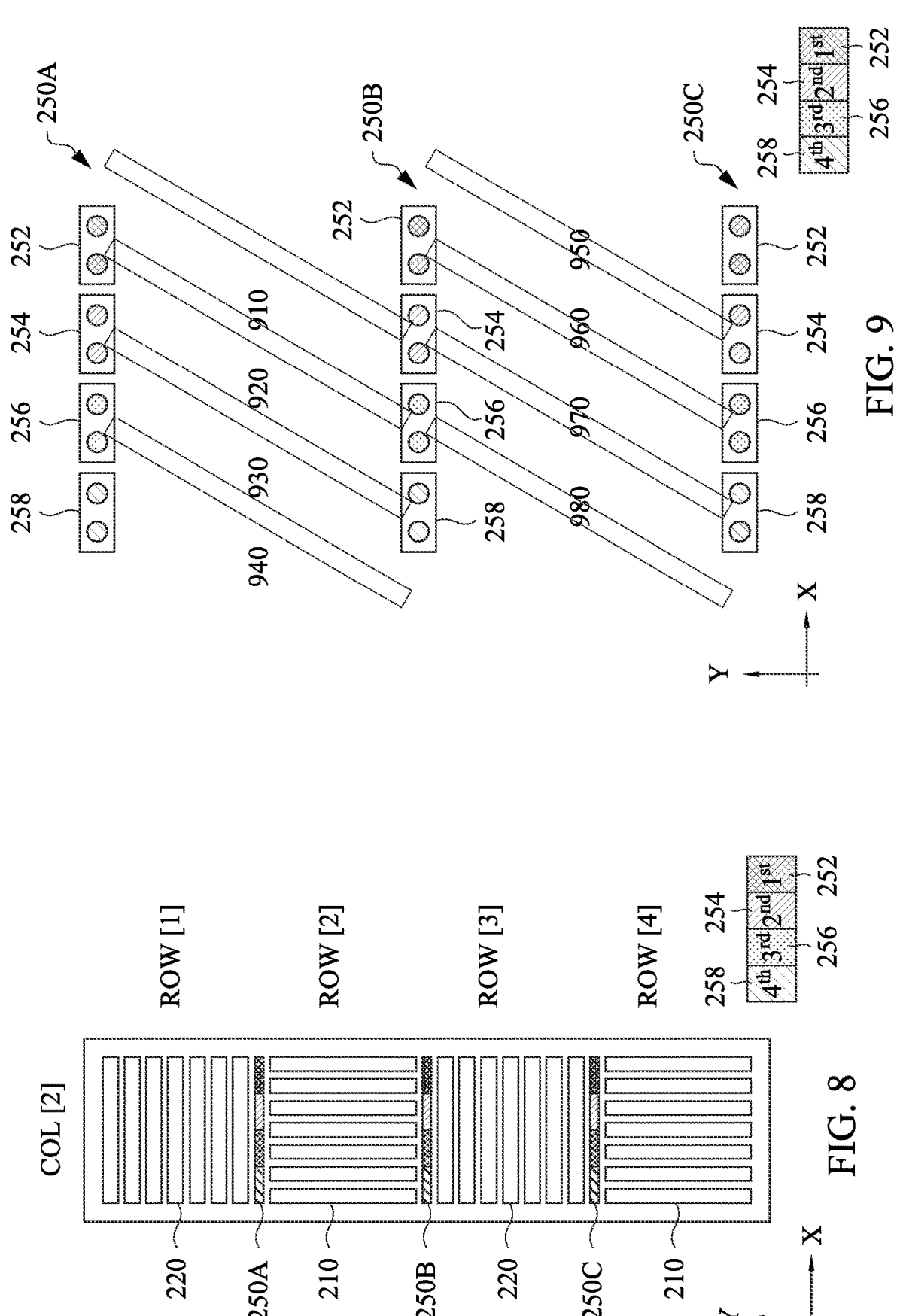
FIG. 8 illustrates a top view of a portion of the implementation of FIG. 2, in accordance with some embodiments.
FIG. 9 illustrates a top view of a portion of the implementation of FIG. 2, in accordance with some embodiments.

FIG. 8 reproduces a portion of the implementation 200, e.g., four trench arrays 210 and 220 in one of the columns (COL[2]) across four of the rows (ROW[1] to ROW[4]), in which each trench array 210/220 may correspond to a via group 250. The via groups 250 interposed between ROW[1] and ROW[2], between ROW[2] and ROW[3], and between ROW[3] and ROW[4] are herein referred to as via group 250A, via group 250B, and via group 250C, respectively. FIG. 9 illustrates a top view of the reproduced implementation shown in FIG. 8, in which a number of metal routings 910, 920, 930, 940, 950, 960, 970, and 980 are shown.

As shown in FIG. 9, each of the via groups 250A to 250C includes a number (e.g., 2) of each of the via structures 252 to 258. To connect the via structures 252 of via group 250A (in contact with the first metal layer 302) to the via structures 256 of via group 250B (in contact with the third metal layer 306), the metal routing 920 is tilted from the X direction or the Y direction by a certain angle. To connect the via structures 254 of via group 250A (in contact with the second metal layer 304) to the via structures 258 of via group 250B (in contact with the fourth metal layer 308), the metal routing 930 is tilted from the X direction or the Y direction by about the same angle. To connect the via structures 252 of via group 250B (in contact with the first metal layer 302) to the via structures 256 of via group 250C (in contact with the third metal layer 306), the metal routing 960 is tilted from the X direction or the Y direction by about the same angle. To connect the via structures 254 of via group 250B (in contact with the second metal layer 304) to the via structures 258 of via group 250C (in contact with the fourth metal layer 308), the metal routing 970 is tilted from the X direction or the Y direction by about the same angle. Similarly, the metal routing 910/950 can be tilted with about the same angle to connect the via structures 254 of via group 250B/250C (in contact with the second metal layer 304) to the via structures 258 of another via group (in contact with the fourth metal layer 308); and the metal routing 940/980 can be tilted with about the same angle to connect the via structures 256 of via group 250A/250B (in contact with the third metal layer 306) to the via structures 252 of yet another via group (in contact with the first metal layer 302). As such, the metal routings 910 to 980 are arranged in parallel with each other.

As a non-limiting example, adjacent ones of the via groups 250A to 250C (of FIGS. 8-9) may be spaced from one another along the Y direction by a distance that is about 3 micrometers to about 4 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figure 10:
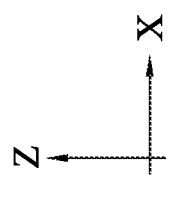
FIG. 10 illustrates a top view of another example implementation of a capacitor of the semiconductor package of FIG. 1, in accordance with some embodiments.

FIG. 10 illustrates a top view of another example implementation 1000 of the capacitor 125 (FIG. 1), in accordance with various embodiments. The implementation 1000 is substantially similar to the implementation 200 of FIG. 2, and thus, the following discussion will be focused on the difference. Herein, the implementation 1000 may sometimes be referred to as capacitor 1000.

Figure 11:
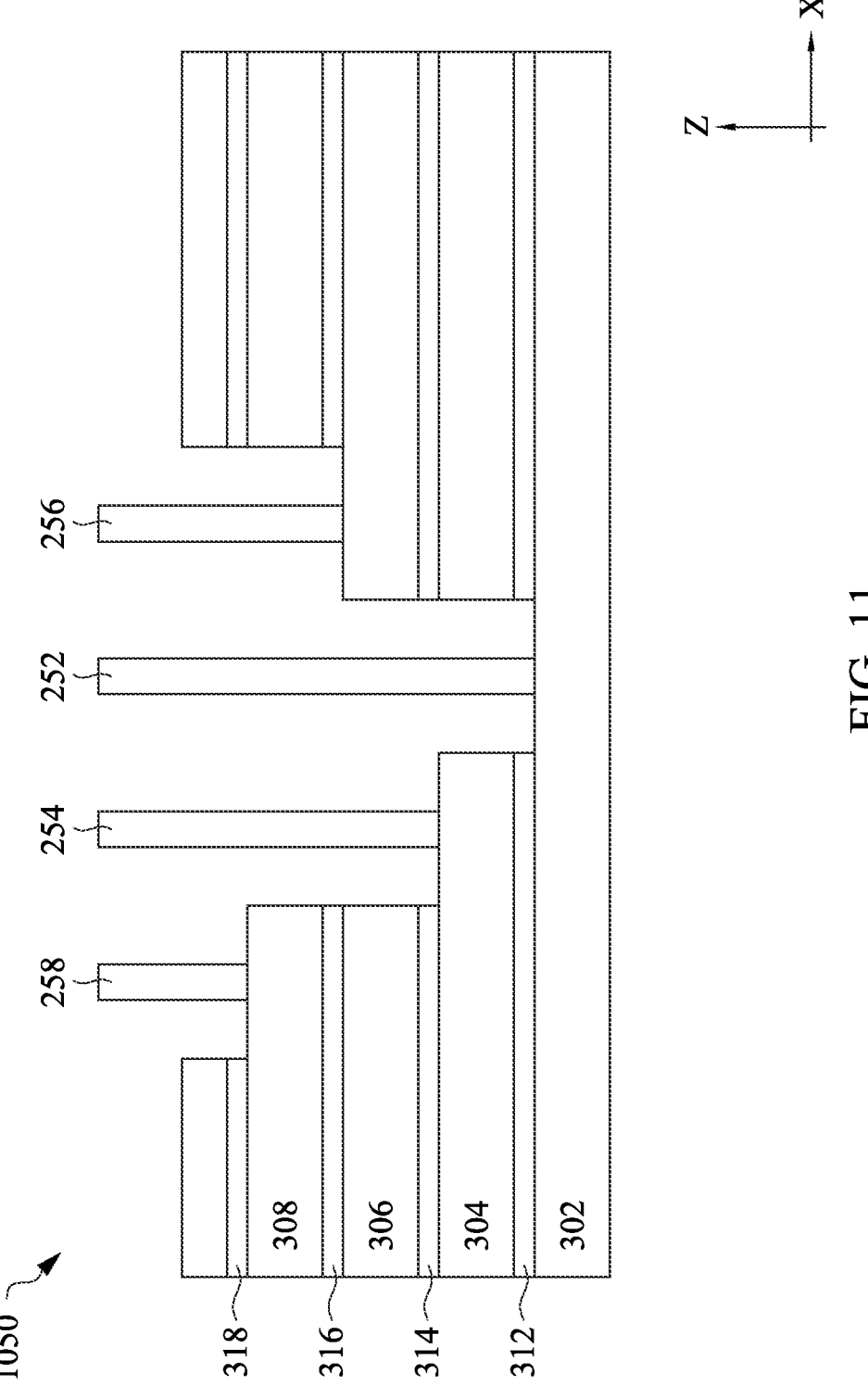
FIG. 11 illustrates a cross-sectional view of a portion of the capacitor of FIG. 10, in accordance with some embodiments.

For example, the capacitor 1000 includes a number of via groups 1050 substantially similar to the via groups 250, except that each of the via groups 1050 has its via structures laterally arranged in a different order than the order of via structures arranged in the via group 250. The via groups 1050 also includes a number of the via structures 252, 254, 256, and 258, connected to the metal layers 302, 304, 306, and 308, respectively, but the via structures 252 to 258 of the capacitor 1000 are laterally arranged in a different order than the order shown in capacitor 200. As shown in a cross-sectional view of FIG. 11 corresponding to the implementation 1000, the via structures 254 and 258 (in contact with the even numbered metal layers 304 and 308) may be arranged immediately next to each other, and the via structures 252 and 256 (in contact with the odd numbered metal layers 302 and 306) may be arranged immediately next to each other.

Figure 13:
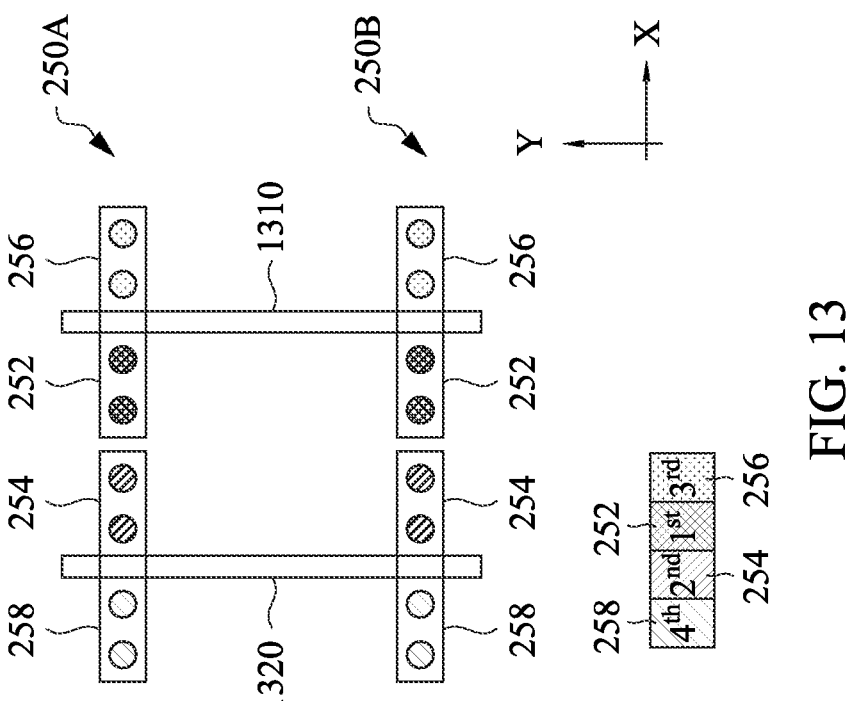
FIG. 13 illustrates a top view of a portion of the implementation of FIG. 10, in accordance with some embodiments.
Figure 12:
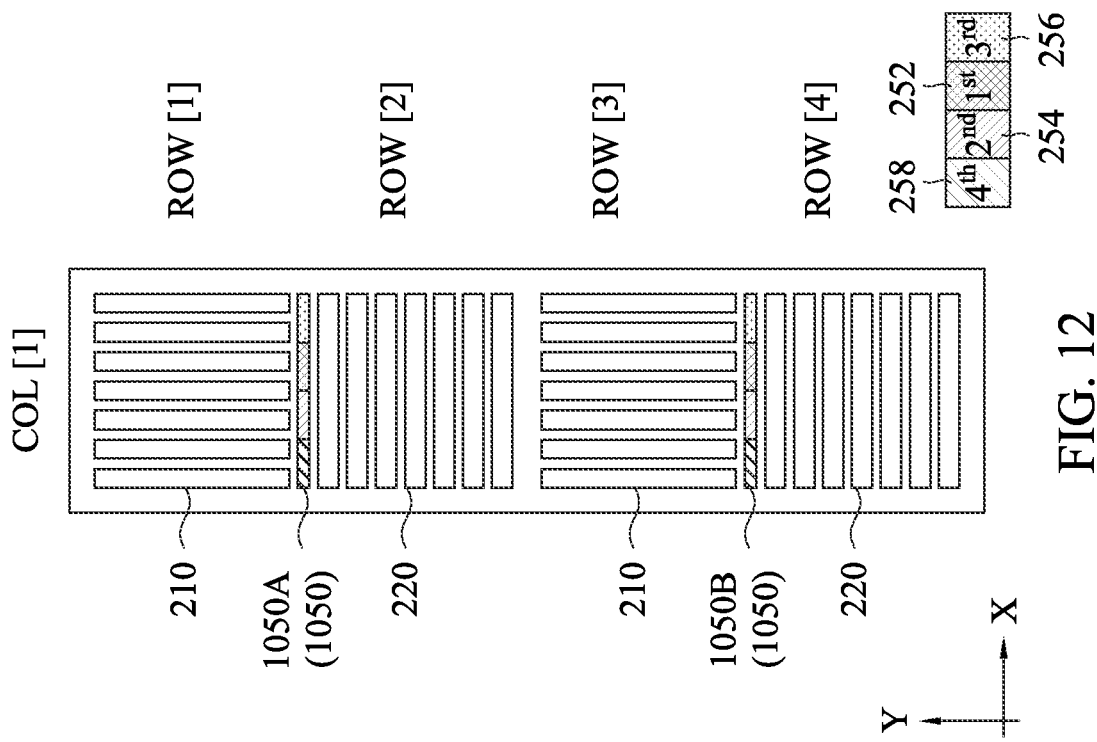
FIG. 12 illustrates a top view of a portion of the implementation of FIG. 10, in accordance with some embodiments.

With such an arrangement of the via groups 1050 shown in the implementation 1000 of FIG. 10, the first and second metal routings may extend along the Y direction. FIG. 12 reproduces a portion of the implementation 1000, e.g., four trench arrays 210 and 220 in one of the columns (COL[1]) across four of the rows (ROW[1] to ROW[4]), in which two trench arrays 210 and 220 share a common via group 1050. The via groups 1050 interposed between ROW[1] and ROW[2] and between ROW[3] and ROW[4] are herein referred to as via group 1050A and via group 1050B, respectively. FIG. 13 illustrates a top view of the reproduced implementation shown in FIG. 12, in which a number of metal routings 1310 and 1320 are shown.

As shown in FIG. 13, each of the via groups 1050A and 1050B includes a number (e.g., 2) of each of the via structures 252 to 258. To connect the via structures 252 and 256 of via group 1050A (in contact with the first metal layer 302 and third metal layer 306, respectively) to the via structures 252 and 256 of via group 1050B (in contact with the first metal layer 302 and third metal layer 306, respectively), the metal routing 1310 can extend along the Y direction. To connect the via structures 254 and 258 of via group 1050A (in contact with the second metal layer 304 and fourth metal layer 308, respectively) to the via structures 254 and 258 of via group 1050B (in contact with the second metal layer 304 and fourth metal layer 308, respectively), the metal routing 1320 can extend along the Y direction. As such, the metal routings 1310 and 1320 are arranged in parallel with each other.

As a non-limiting example, the via groups 1050A and 1050B (of FIGS. 12-13) may be spaced from each other along the Y direction by a distance that is about 6 microm-eters to about 7 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figure 15:
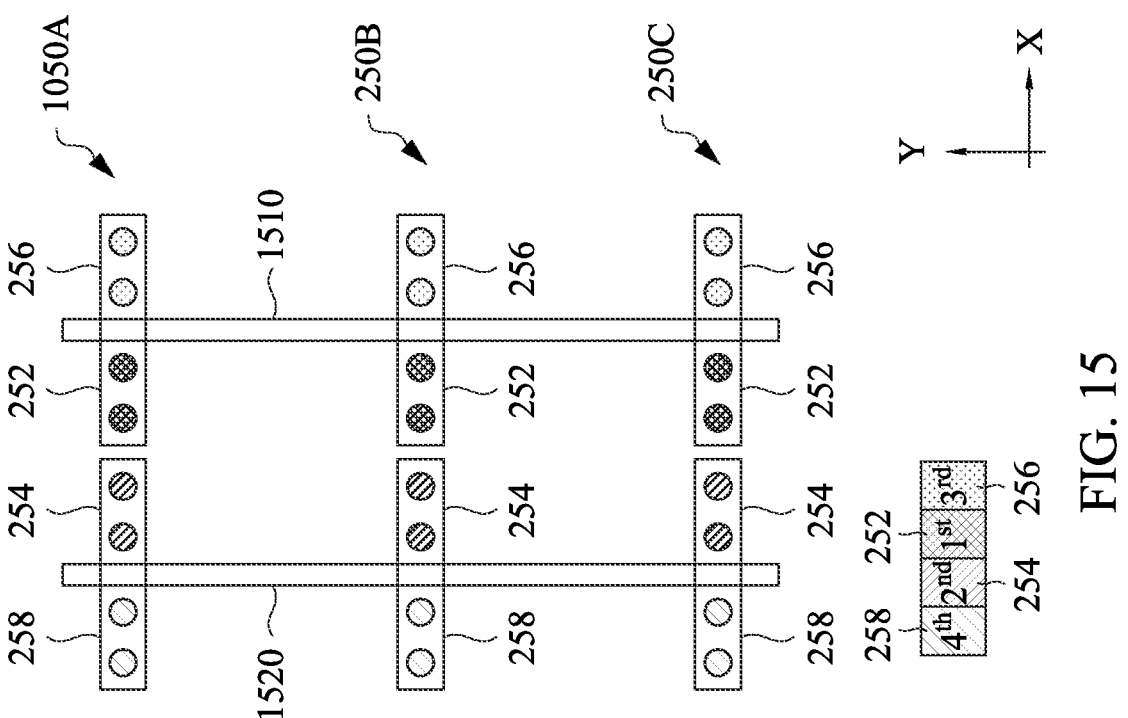
FIG. 15 illustrates a top view of a portion of the implementation of FIG. 10, in accordance with some embodiments.
Figure 14:
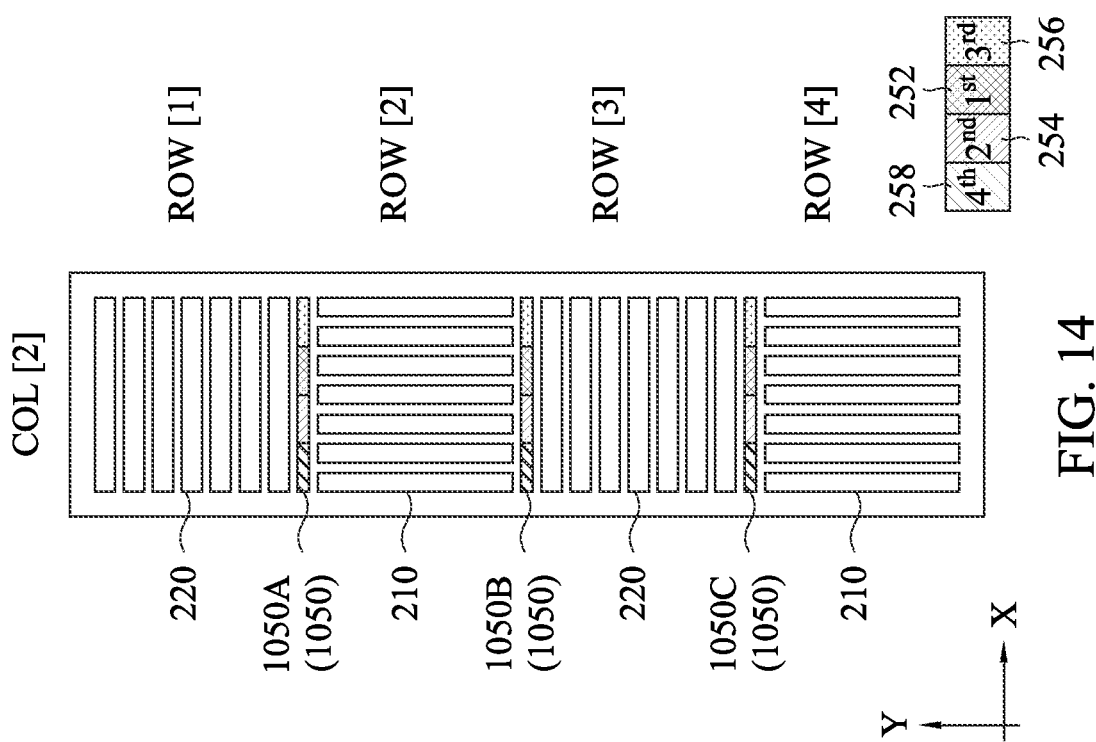
FIG. 14 illustrates a top view of a portion of the implementation of FIG. 10, in accordance with some embodiments.

FIG. 14 reproduces a portion of the implementation 1000, e.g., four trench arrays 210 and 220 in one of the columns (COL[2]) across four of the rows (ROW[1] to ROW[4]), in which each trench array 210/220 may correspond to a via group 1050. The via groups 1050 interposed between ROW [1] and ROW[2], between ROW[2] and ROW[3], and between ROW[3] and ROW[4] are herein referred to as via group 1050A, via group 1050B, and via group 1050C, respectively. FIG. 15 illustrates a top view of the reproduced implementation shown in FIG. 14, in which a number of metal routings 1510 and 1520 are shown.

As shown in FIG. 15, each of the via groups 1050A to 1050C includes a number (e.g., 2) of each of the via structures 252 to 258. To connect the via structures 252 and 256 of via group 1050A (in contact with the first metal layer 302 and third metal layer 306, respectively) to the via structures 252 and 256 of via group 1050B/1050C (in contact with the first metal layer 302 and third metal layer 306, respectively), the metal routing 1510 can extend along the Y direction. To connect the via structures 254 and 258 of via group 1050A (in contact with the second metal layer 304 and fourth metal layer 308, respectively) to the via structures 254 and 258 of via group 1050B/1050C (in contact with the second metal layer 304 and fourth metal layer 308, respectively), the metal routing 1520 can extend along the Y direction. As such, the metal routings 1510 and 1520 are arranged in parallel with each other.

As a non-limiting example, adjacent ones of the via groups 1050A to 1050C (of FIGS. 14-15) may be spaced from one another along the Y direction by a distance that is about 3 micrometers to about 4 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figure 16:
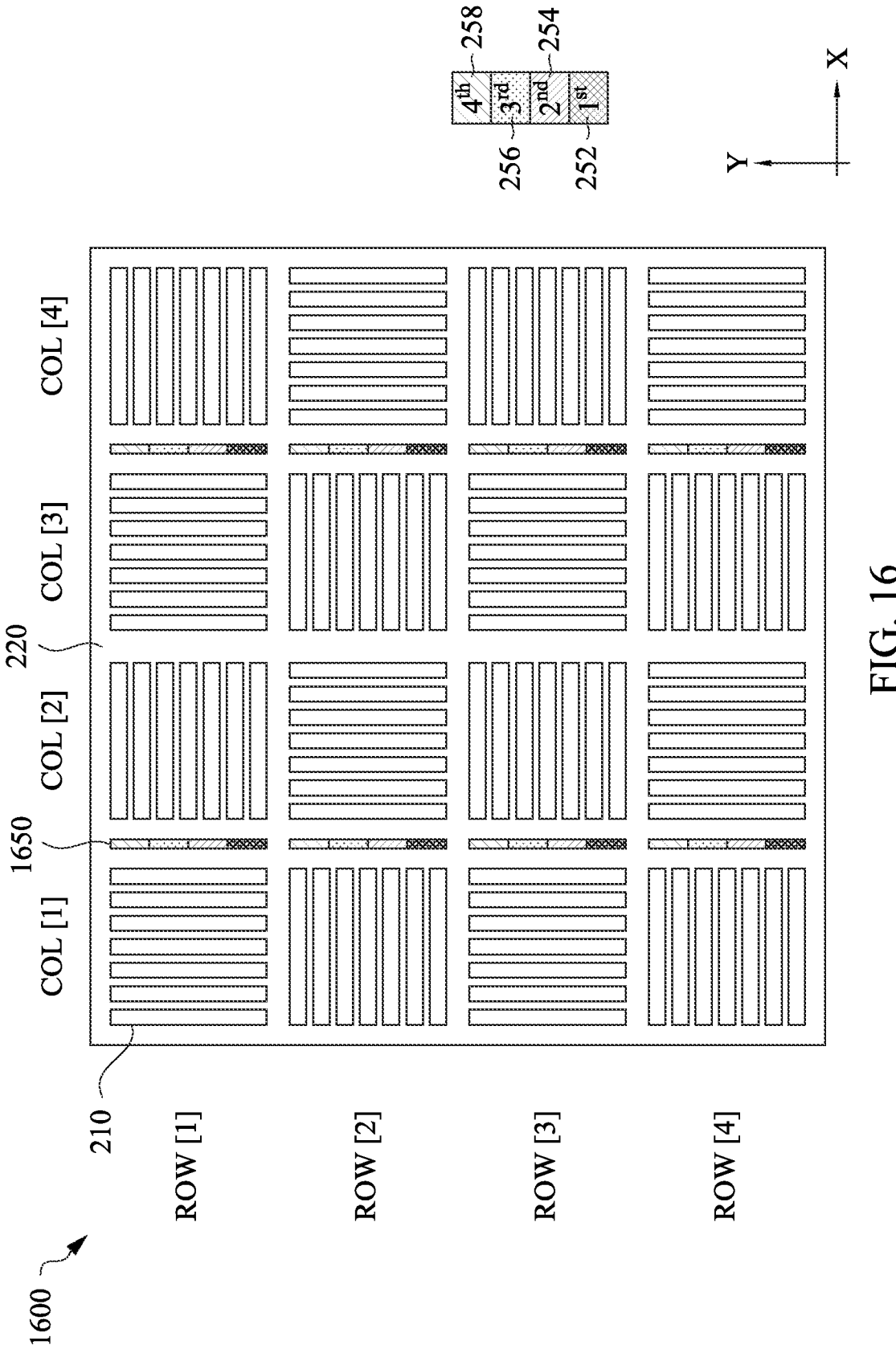
FIG. 16 illustrates a top view of another example implementation of a capacitor of the semiconductor package of FIG. 1, in accordance with some embodiments.

FIG. 16 illustrates a top view of yet another example implementation 1600 of the capacitor 125 (FIG. 1), in accordance with various embodiments. The implementation 1600 is substantially similar to the implementation 200 of FIG. 2, and thus, the following discussion will be focused on the difference. Herein, the implementation 1600 may some-times be referred to as capacitor 1600.

Figure 17:
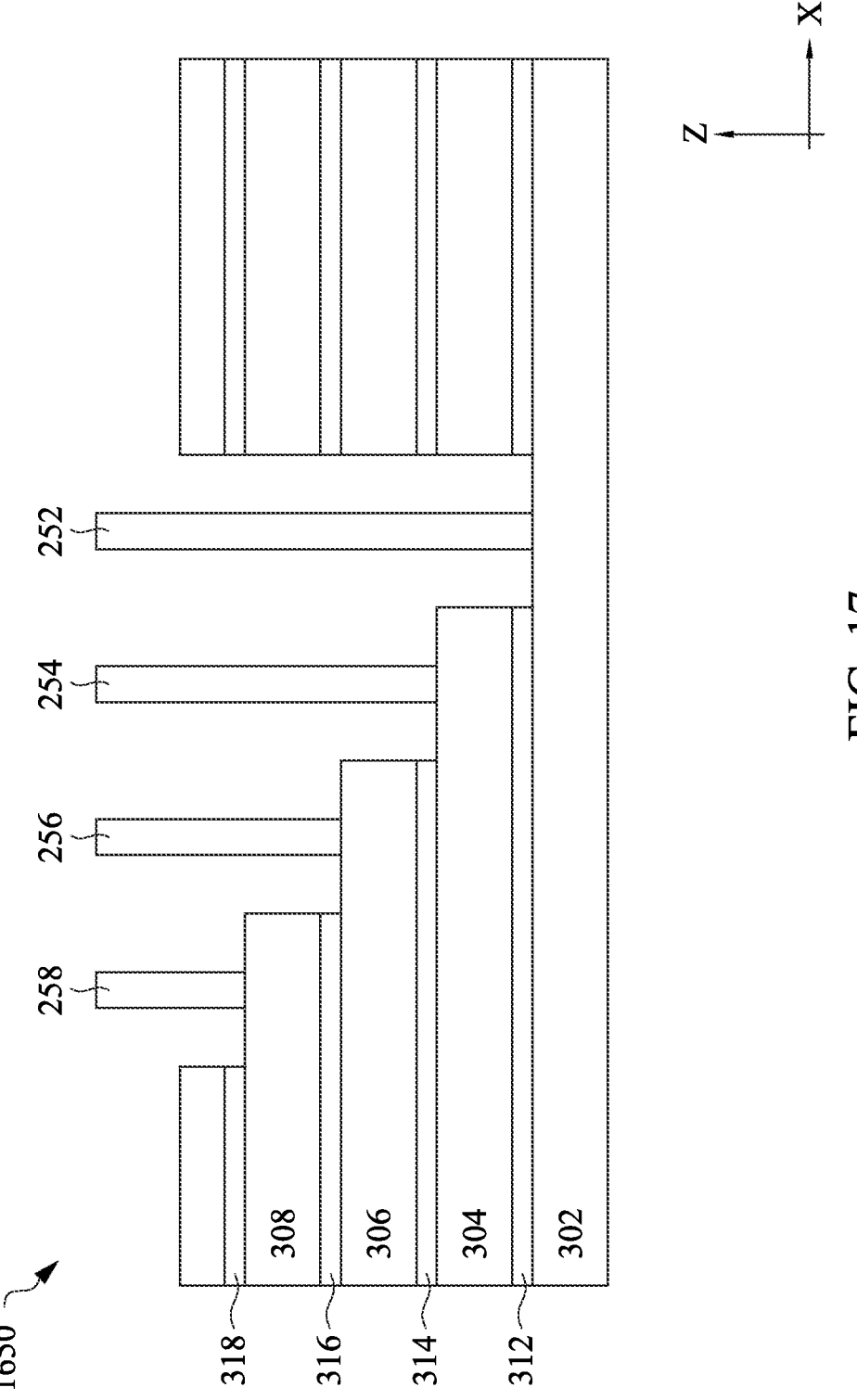
FIG. 17 illustrates a cross-sectional view of a portion of the capacitor of FIG. 16, in accordance with some embodiments.

For example, the capacitor 1600 includes a number of via groups 1650 substantially similar to the via groups 250, except that each of the via groups 1650 has its lengthwise direction different from the lengthwise direction of the via group 250. The via group 1650 also includes a number of the via structures 252, 254, 256, and 258, connected to the metal layers 302, 304, 306, and 308, respectively, but the via structures 252 to 258 of the capacitor 1600 extend along a different lateral direction (e.g., the Y direction), when com-pared to the lateral direction along which the via group 250 extends (e.g., the X direction). As shown in a cross-sectional view of FIG. 17 corresponding to the implementation 1600, the via structures 252 to 258 (in contact with the metal layers 302 to 308, respectively) may be laterally arranged with respect to one another along the Y direction.

Figures 18, 19:
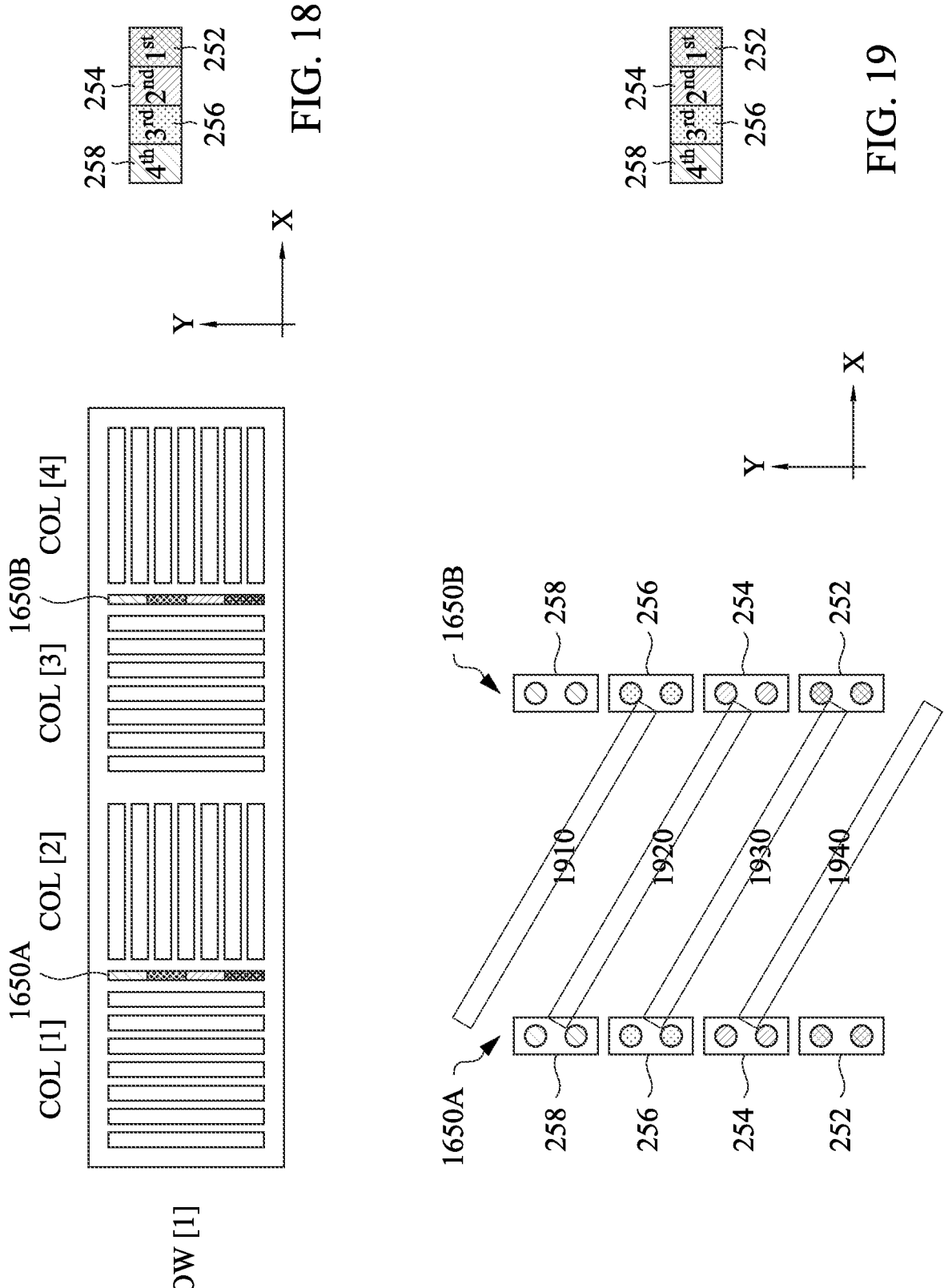
FIG. 18 illustrates a top view of a portion of the implementation of FIG. 16, in accordance with some embodiments.
FIG. 19 illustrates a top view of a portion of the implementation of FIG. 16, in accordance with some embodiments.

With such an arrangement of the via groups 1650 shown in the implementation 1600 of FIG. 16, the first and second metal routings may be tilted from the X direction or the Y direction. FIG. 18 reproduces a portion of the implementa-tion 1600, e.g., four trench arrays 210 and 220 in one of the rows (ROW[1]) across four of the columns (COL[1] to COL[4]), in which two trench arrays 210 and 220 share a common via group 1650. The via groups 1650 interposed between COL[1] and COL[2] and between COL[3] and COL[4] are herein referred to as via group 1650A and via group 1650B, respectively. FIG. 19 illustrates a top view of the reproduced implementation shown in FIG. 18, in which a number of metal routings 1910, 1920, 1930, and 1940 are shown.

As shown in FIG. 19, each of the via groups 1650A and 1650B includes a number (e.g., 2) of each of the via structures 252 to 258. To connect the via structures 252 of via group 1650B (in contact with the first metal layer 302) to the via structures 256 of via group 1650A (in contact with the third metal layer 306), the metal routing 1930 is tilted from the X direction or the Y direction by a certain angle. To connect the via structures 254 of via group 1650B (in contact with the second metal layer 304) to the via structures 258 of via group 1650A (in contact with the fourth metal layer 308), the metal routing 1920 is tilted from the X direction or the Y direction by about the same angle. Similarly, the metal routing 1940 can be tilted with about the same angle to connect the via structures 254 of via group 1650A (in contact with the second metal layer 304) to the via structures 258 of another via group (in contact with the fourth metal layer 308); and the metal routing 1910 can be tilted with about the same angle to connect the via structures 256 of via group 1650B (in contact with the third metal layer 306) to the via structures 252 of yet another via group (in contact with the first metal layer 302). As such, the metal routings 1910 to 1940 are arranged in parallel with each other.

As a non-limiting example, the via groups 1650A and 1650B (of FIGS. 18-19) may be spaced from each other along the X direction by a distance that is about 6 micrometers to about 7 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figures 20, 21:
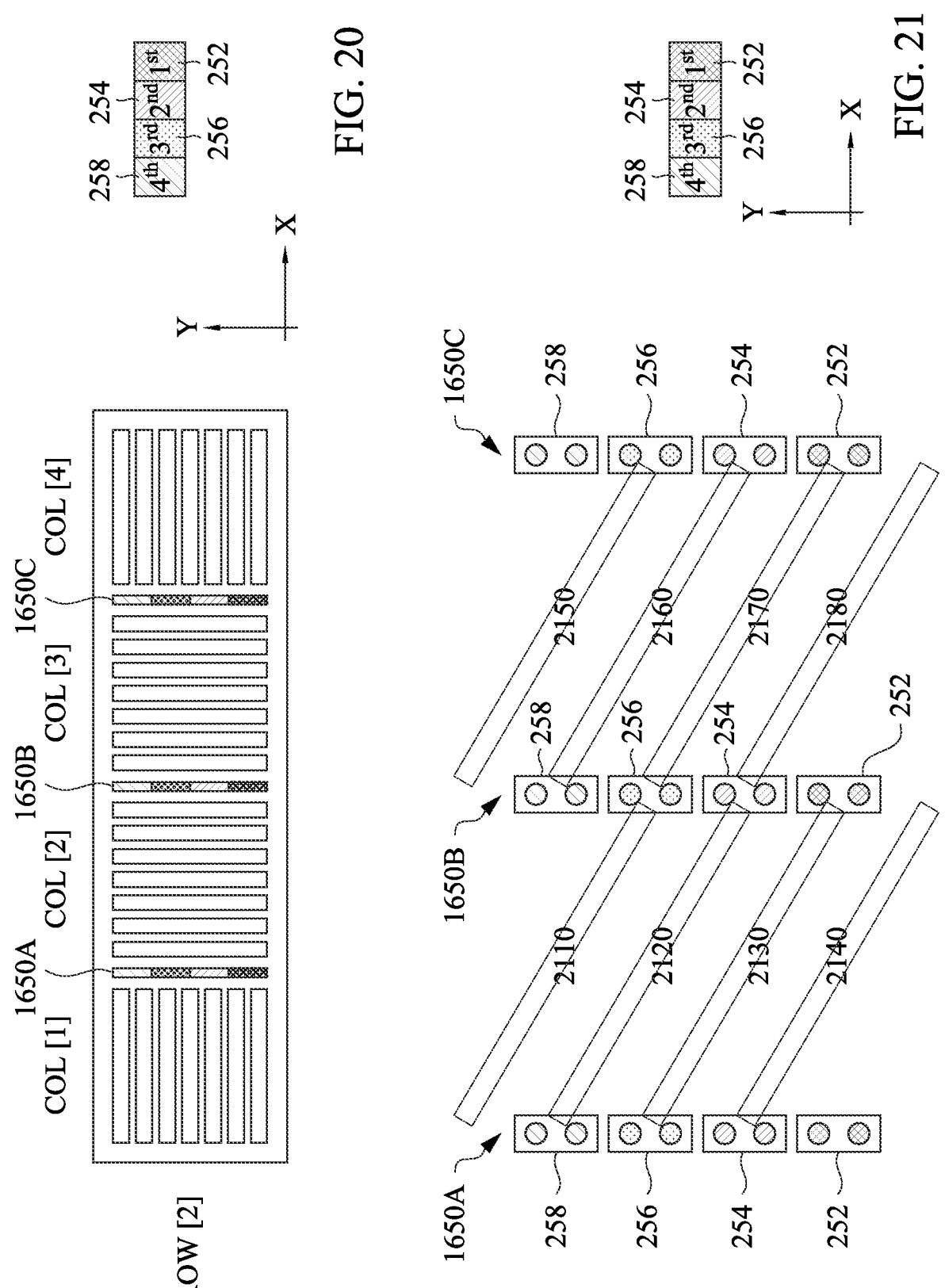
FIG. 20 illustrates a top view of a portion of the implementation of FIG. 16, in accordance with some embodiments.
FIG. 21 illustrates a top view of a portion of the implementation of FIG. 16, in accordance with some embodiments.

FIG. 20 reproduces a portion of the implementation 1600, e.g., four trench arrays 210 and 220 in one of the rows (ROW[2]) across four of the columns (COL[1] to COL[4]), in which each trench array 210/220 may correspond to a via group 1650. The via groups 1650 interposed between COL [1] and COL[2], between COL[2] and COL[3], and between COL[3] and COL[4] are herein referred to as via group 1650A, via group 1650B, and via group 1650C, respectively. FIG. 21 illustrates a top view of the reproduced implementation shown in FIG. 20, in which a number of metal routings 2110, 2120, 2130, 2140, 2150, 2160, 2170, and 2180 are shown.

As shown in FIG. 21, each of the via groups 1650A to 1650C includes a number (e.g., 2) of each of the via structures 252 to 258. To connect the via structures 252 of via group 1650C (in contact with the first metal layer 302) to the via structures 256 of via group 1650B (in contact with the third metal layer 306), the metal routing 2170 is tilted from the X direction or the Y direction by a certain angle. To connect the via structures 254 of via group 1650C (in contact with the second metal layer 304) to the via structures 258 of via group 1650B (in contact with the fourth metal layer 308), the metal routing 2160 is tilted from the X direction or the Y direction by about the same angle. To connect the via structures 252 of via group 1650B (in contact with the first metal layer 302) to the via structures 256 of via group 1650A (in contact with the third metal layer 306), the metal routing 2130 is tilted from the X direction or the Y direction by about the same angle. To connect the via structures 254 of via group 1650B (in contact with the second metal layer 304) to the via structures 258 of via group 1650A (in contact with the fourth metal layer 308), the metal routing 2120 is tilted from the X direction or the Y direction by about the same angle. Similarly, the metal routing 2140/2180 can be tilted with about the same angle to connect the via structures 254 of via group 1650A/1650B (in contact with the second metal layer 304) to the via structures 258 of another via group (in contact with the fourth metal layer 308); and the metal routing 2110/2150 can be tilted with about the same angle to connect the via structures 256 of via group 1650B/ 1650C (in contact with the third metal layer 306) to the via structures 252 of yet another via group (in contact with the first metal layer 302). As such, the metal routings 2110 to 2180 are arranged in parallel with each other.

As a non-limiting example, adjacent ones of the via groups 1650A to 1650C (of FIGS. 20-21) may be spaced from one another along the X direction by a distance that is about 3 micrometers to about 4 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figure 22:
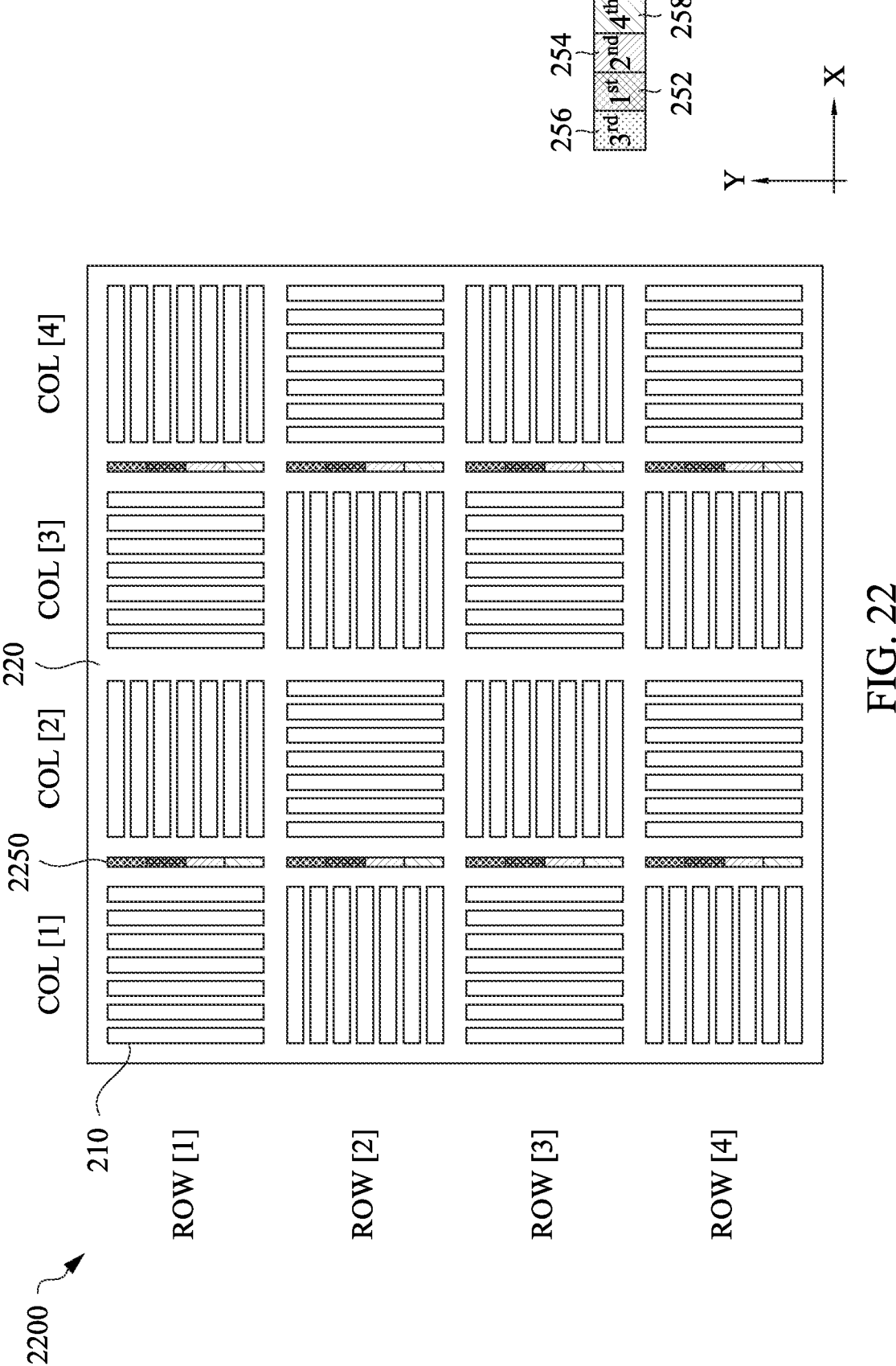
FIG. 22 illustrates a top view of another example implementation of a capacitor of the semiconductor package of FIG. 1, in accordance with some embodiments.

FIG. 22 illustrates a top view of yet another example implementation 2200 of the capacitor 125 (FIG. 1), in accordance with various embodiments. The implementation 2200 is substantially similar to the implementation 1600 of FIG. 16, and thus, the following discussion will be focused on the difference. Herein, the implementation 2200 may sometimes be referred to as capacitor 2200.

Figure 23:
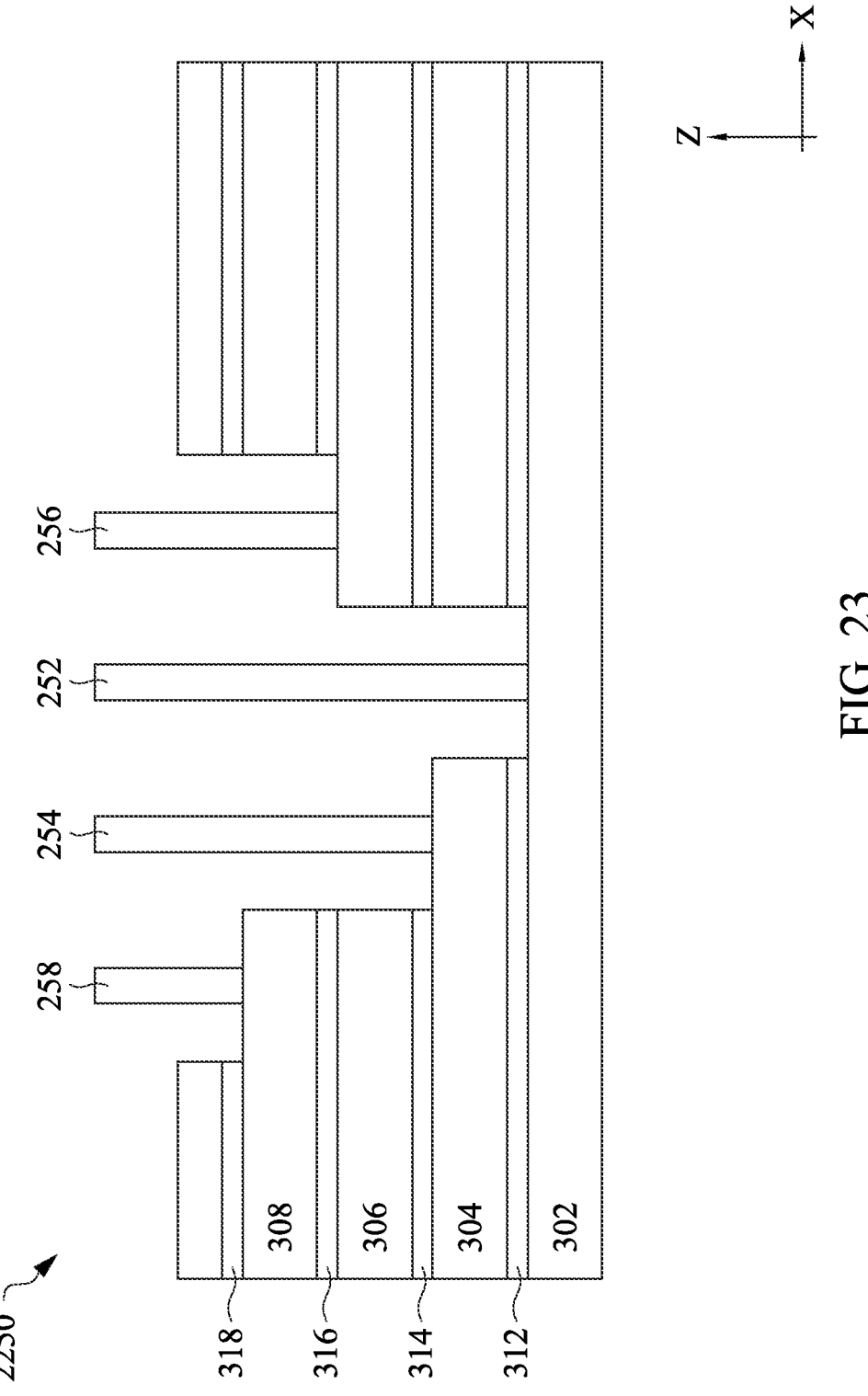
FIG. 23 illustrates a cross-sectional view of a portion of the capacitor of FIG. 22, in accordance with some embodiments.

For example, the capacitor 2200 includes a number of via groups 2250 substantially similar to the via groups 1650, except that each of the via groups 2250 has its via structures laterally arranged in a different order than the order of via structures arranged in the via group 1650. The via groups 2250 also includes a number of the via structures 252, 254, 256, and 258, connected to the metal layers 302, 304, 306, and 308, respectively, but the via structures 252 to 258 of the capacitor 2200 are laterally arranged in a different order than the order shown in capacitor 1600. As shown in a cross-sectional view of FIG. 23 corresponding to the implementation 2200, the via structures 254 and 258 (in contact with the even numbered metal layers 304 and 308) may be arranged immediately next to each other, and the via structures 252 and 256 (in contact with the odd numbered metal layers 302 and 306) may be arranged immediately next to each other.

Figure 24:
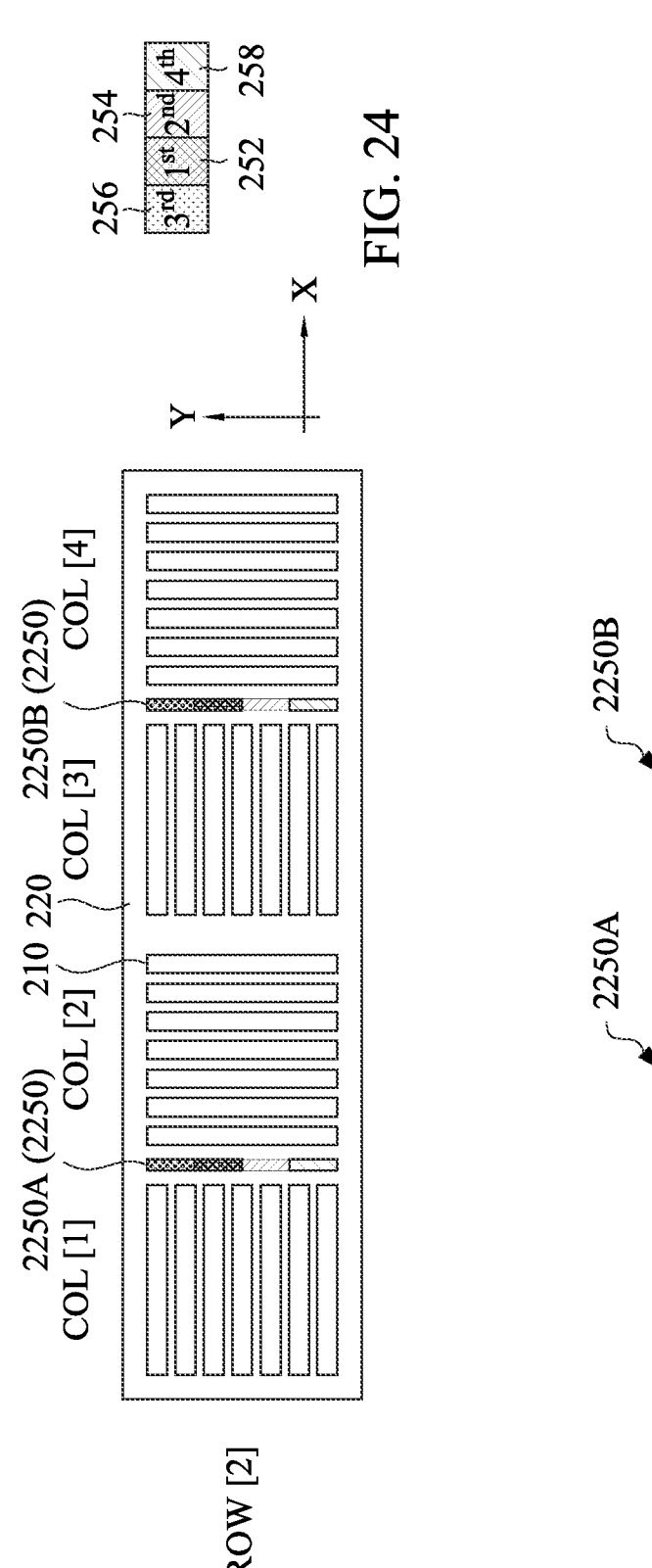
FIG. 24 and FIG. 25 each illustrates illustrate a top view of a portion of the implementation of FIG. 22, in accordance with some embodiments.
Figure 25:
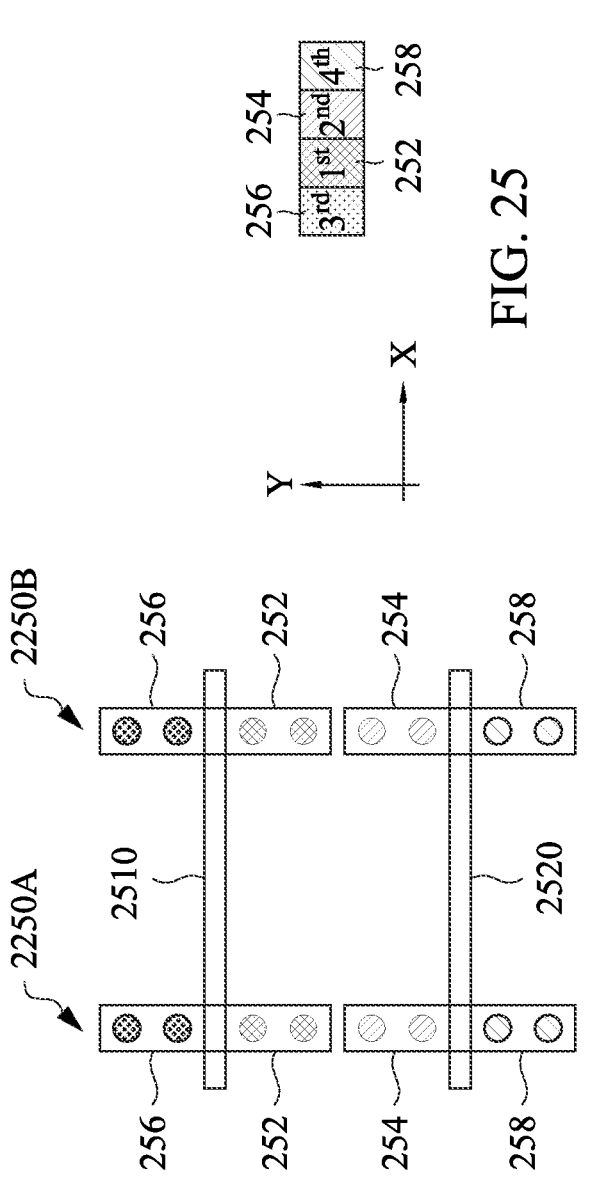

With such an arrangement of the via groups 2250 shown in the implementation 2200 of FIG. 22, the first and second metal routings may extend along the X direction. FIG. 24 reproduces a portion of the implementation 2200, e.g., four trench arrays 210 and 220 in one of the rows (ROW[2]) across four of the columns (COL[1] to COL[4]), in which two trench arrays 210 and 220 share a common via group 2250. The via groups 2250 interposed between COL[1] and COL[2] and between COL[3] and COL[4] are herein referred to as via group 2250A and via group 2250B, respectively. FIG. 25 illustrates a top view of the reproduced implementation shown in FIG. 24, in which a number of metal routings 2510 and 2520 are shown.

As shown in FIG. 25, each of the via groups 2250A and 2250B includes a number (e.g., 2) of each of the via structures 252 to 258. To connect the via structures 252 and 256 of via group 2250A (in contact with the first metal layer 302 and third metal layer 306, respectively) to the via structures 252 and 256 of via group 2250B (in contact with the first metal layer 302 and third metal layer 306, respectively), the metal routing 2510 can extend along the X direction. To connect the via structures 254 and 258 of via group 2250A (in contact with the second metal layer 304 and fourth metal layer 308, respectively) to the via structures 254 and 258 of via group 2250B (in contact with the second metal layer 304 and fourth metal layer 308, respectively), the metal routing 2520 can extend along the X direction. As such, the metal routings 2510 and 2520 are arranged in parallel with each other.

As a non-limiting example, the via groups 2250A and 2250B (of FIGS. 24-25) may be spaced from each other along the X direction by a distance that is about 6 micrometers to about 7 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figure 26:
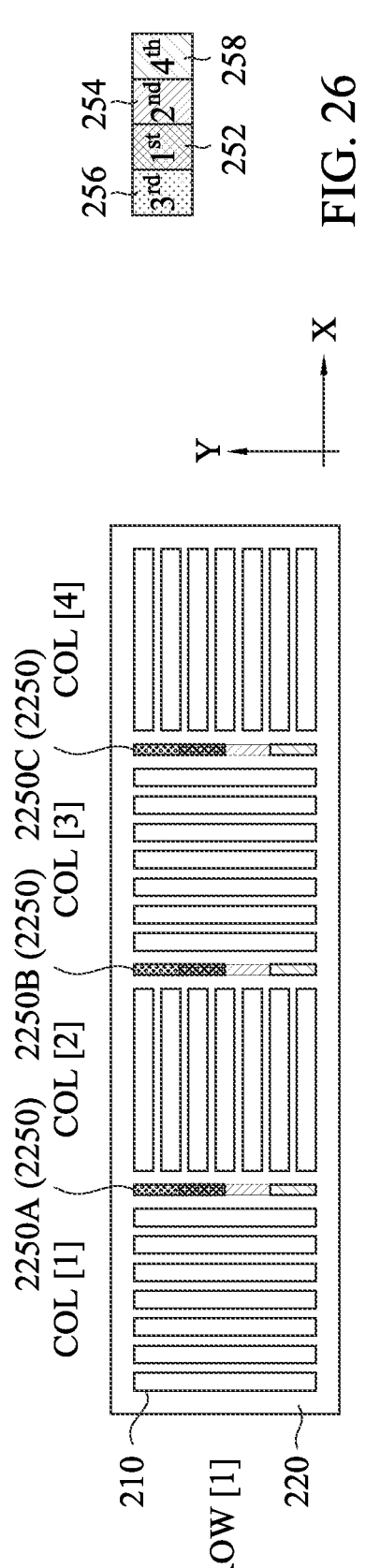
FIG. 26 illustrates a top view of a portion of the implementation of FIG. 22, in accordance with some embodiments.
Figure 27:
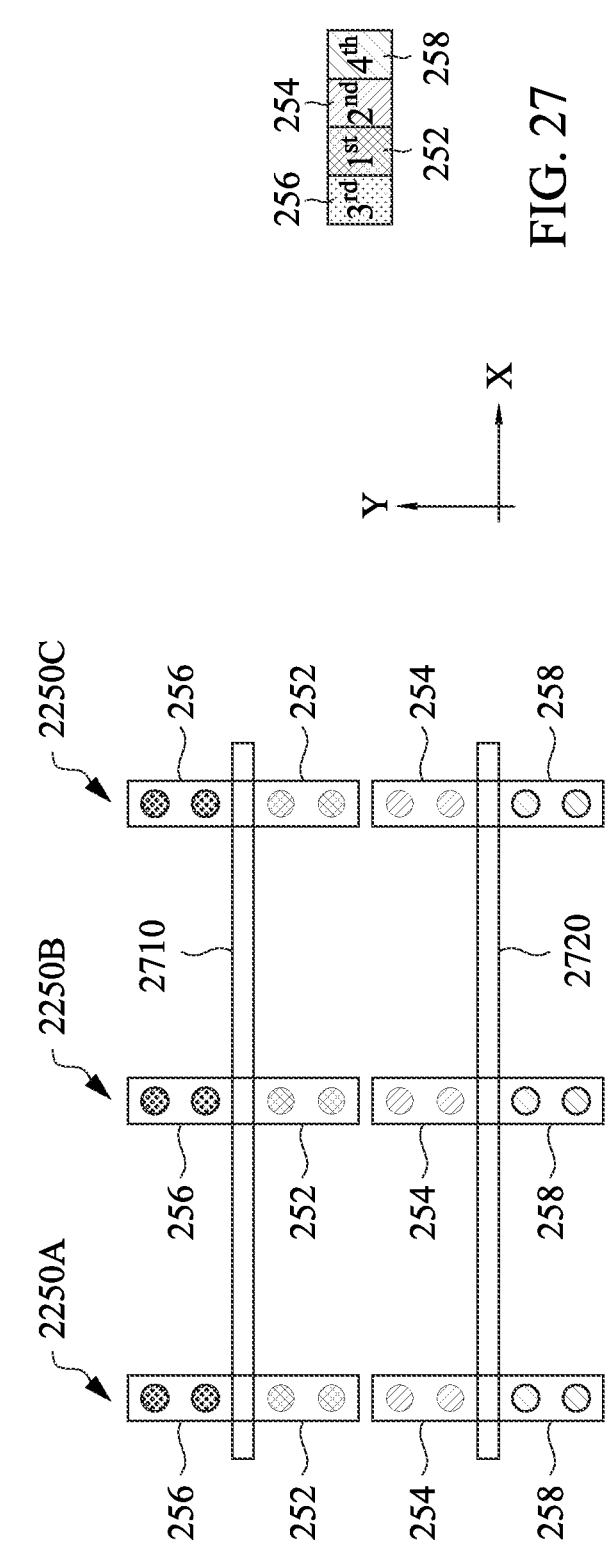
FIG. 27 illustrates a top view of a portion of the implementation of FIG. 22, in accordance with some embodiments.

FIG. 26 reproduces a portion of the implementation 2200, e.g., four trench arrays 210 and 220 in one of the rows (ROW[1]) across four of the columns (COL[1] to COL[4]), in which each trench array 210/220 may correspond to a via group 2250. The via groups 2250 interposed between COL [1] and COL[2], between COL[2] and COL[3], and between COL[3] and COL[4] are herein referred to as via group 2250A, via group 2250B, and via group 2250C, respectively. FIG. 27 illustrates a top view of the reproduced implementation shown in FIG. 26, in which a number of metal routings 2710 and 2720 are shown.

As shown in FIG. 27, each of the via groups 2250A to 2250C includes a number (e.g., 2) of each of the via structures 252 to 258. To connect the via structures 252 and 256 of via group 2250A (in contact with the first metal layer 302 and third metal layer 306, respectively) to the via structures 252 and 256 of via group 2250B/2250C (in contact with the first metal layer 302 and third metal layer 306, respectively), the metal routing 2710 can extend along the X direction. To connect the via structures 254 and 258 of via group 2250A (in contact with the second metal layer 304 and fourth metal layer 308, respectively) to the via structures 254 and 258 of via group 2250B/2250C (in contact with the second metal layer 304 and fourth metal layer 308, respectively), the metal routing 2720 can extend along the X direction. As such, the metal routings 2710 and 2720 are arranged in parallel with each other.

As a non-limiting example, adjacent ones of the via groups 2250A to 2250C (of FIGS. 26-27) may be spaced from one another along the X direction by a distance that is about 3 micrometers to about 4 micrometers. Further, each of the via structures can have a width (in the X direction) that is about 0.1 micrometers to about 0.2 micrometers, with a spacing between adjacent ones of the via structures that is about 0.1 micrometers to about 0.3 micrometers.

Figure 28:
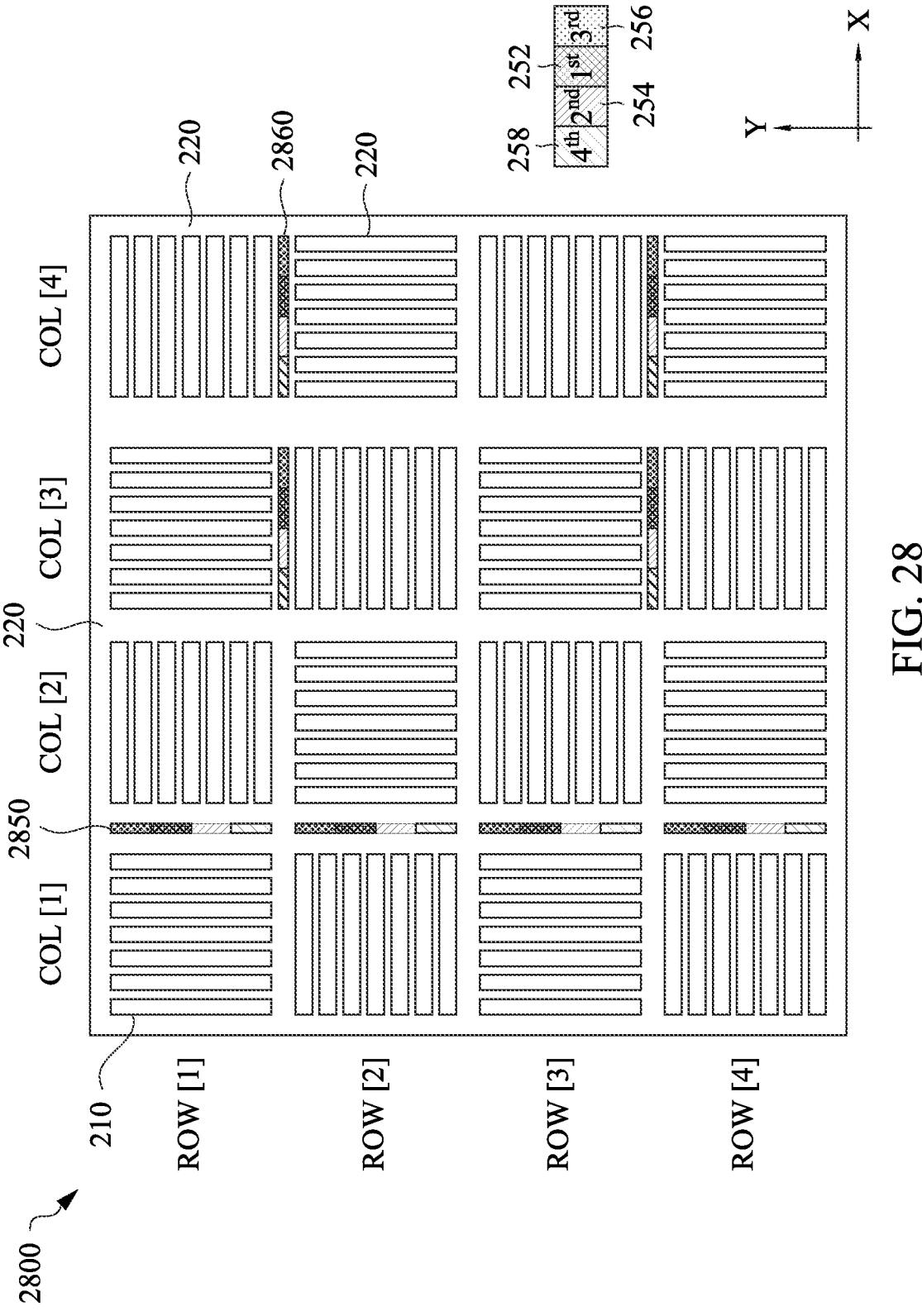
FIG. 28 illustrates a top view of another example implementation of a capacitor of the semiconductor package of FIG. 1, in accordance with some embodiments.

FIG. 28 illustrates a top view of yet another example implementation 2800 of the capacitor 125 (FIG. 1), in accordance with various embodiments. The implementation 2800 has at least a portion substantially similar to the implementation 1000 of FIG. 10 or the implementation 2200 of FIG. 22, and thus, the following discussion will be focused on the difference. Herein, the implementation 2800 may sometimes be referred to as capacitor 2800.

Figure 29:
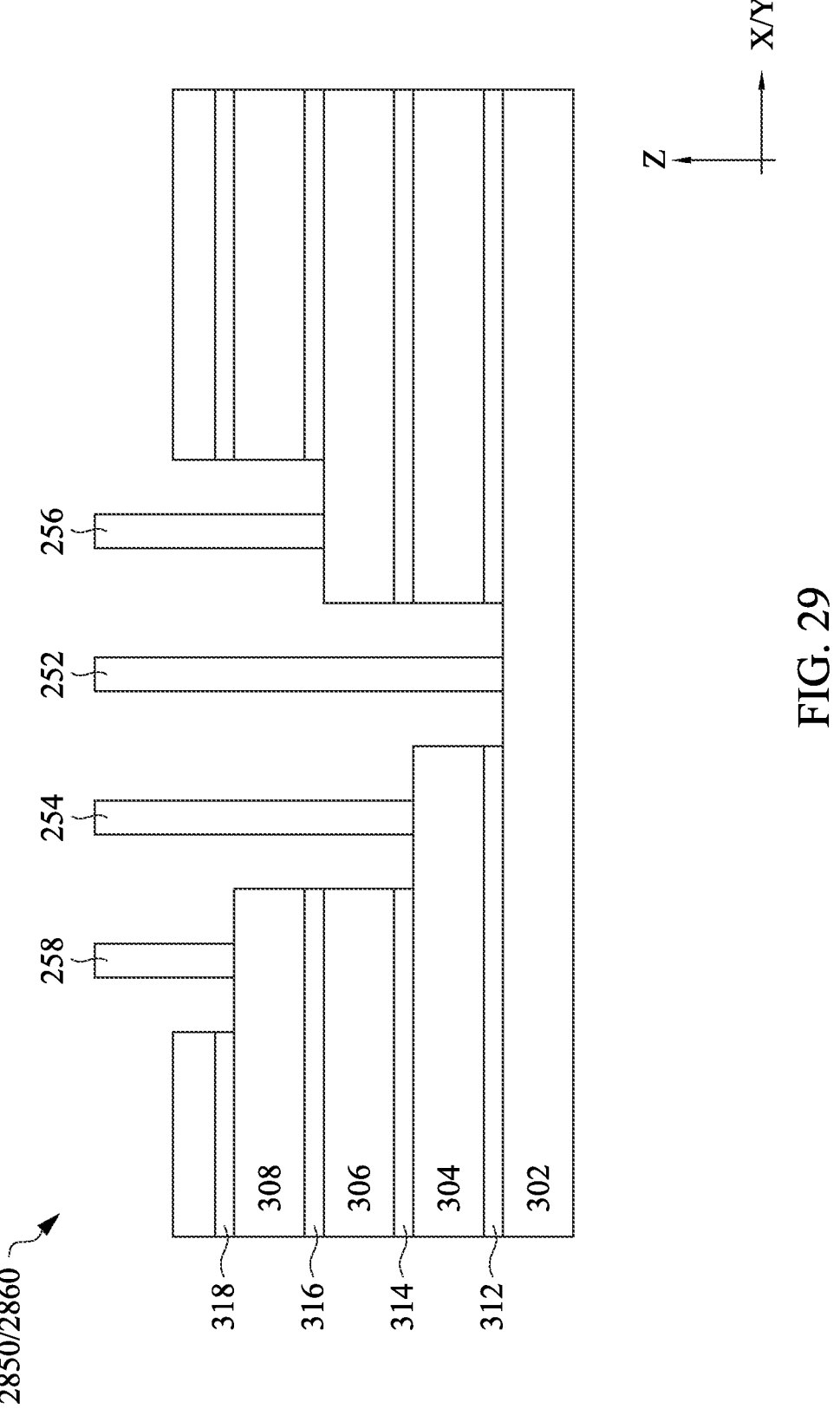
FIG. 29 illustrates a cross-sectional view of a portion of the capacitor of FIG. 28, in accordance with some embodiments.

For example, the capacitor 2800 includes a number of via groups 2850 substantially similar to the via groups 2250, and a number of via groups 2860 substantially similar to the via groups 1050. The via groups 2850 also includes a number of the via structures 252, 254, 256, and 258, connected to the metal layers 302, 304, 306, and 308, respectively, and the via structures 252 to 258 of the capacitor 2800 are laterally arranged in the similar order to the order shown in capacitor 2200. Similarly, the via groups 2860 also includes a number of the via structures 252, 254, 256, and 258, connected to the metal layers 302, 304, 306, and 308, respectively, and the via structures 252 to 258 of the capacitor 2800 are laterally arranged in the similar order to the order shown in capacitor 1000. As shown in a cross-sectional view of FIG. 29 corresponding to the implementation 2800, the via structures 254 and 258 (in contact with the even numbered metal layers 304 and 308) may be arranged immediately next to each other, and the via structures 252 and 256 (in contact with the odd numbered metal layers 302 and 306) may be arranged immediately next to each other.

Figure 30:
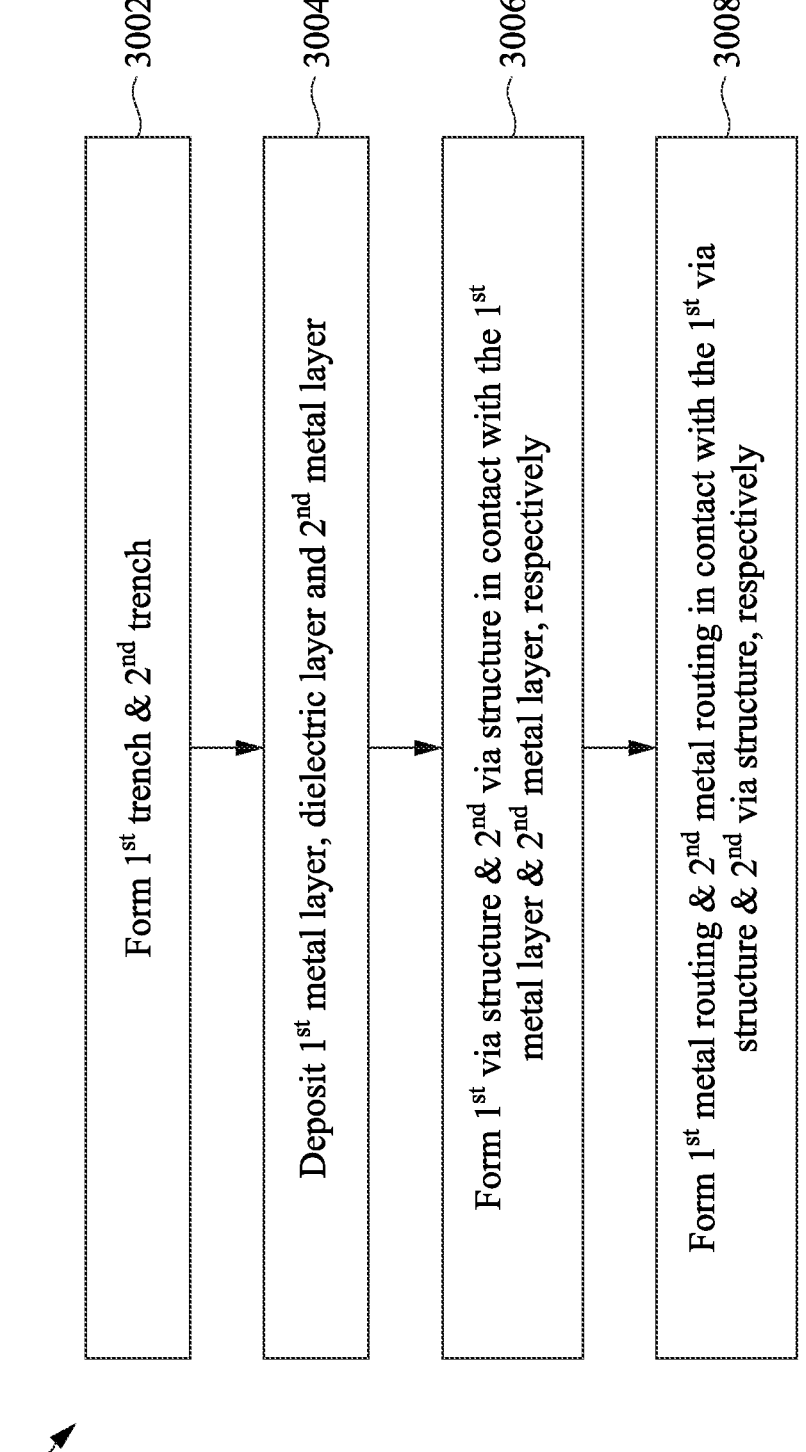
FIG. 30 illustrates an example flow chart of a method for fabricating a semiconductor device (e.g., a capacitor), in accordance with some embodiments.

FIG. 30 illustrates a flowchart of an example method 3000 of fabricating a semiconductor device (e.g., a deep trench capacitor), in accordance with some embodiments. The method 3000 may be used to fabricate a capacitor having high capacitance density, e.g., capacitor 125. For example, at least some of the operations described in the method 3000 use implementation 200, 1000, 1600, 2200, or 2800, as described above, to form a capacitor. It is noted that the method 3000 is merely an example and is not intended to limit the present disclosure. Accordingly, it should be understood that additional operations may be provided before, during, and after the method 3000 of FIG. 30, and that some other operations may only be briefly described herein.

Referring first to operation 3002, at least one first trench and at least one second trench are formed in a semiconductor substrate. In various embodiments, the first trench (e.g., 212) may extend into the substrate (e.g., substrate 202) and along a first lateral direction, and the second trench (e.g., 222) may extend into the substrate (e.g., substrate 202) and along a second lateral direction. Further, a plural number of the first trench 212 may form a first trench array (e.g., 210), and a plural number of the second trench 222 may form a second trench array (e.g., 220). The first and second trenches 212 and 222 may be formed using lithographic processes such as etching the substrate with photomasks.

Referring next to operation 3004, at least one first metal layer, one dielectric layer, and one second metal layer are sequentially deposited. In various embodiments, the first metal layer (e.g., 302), dielectric layer (e.g., 312), and second metal layer (e.g., 304) can fill each of the first trench 212 and second trench 222. The dielectric layer 312 is interposed between the first metal layer 302 and second metal layer 304. As such, the first metal layer 302 and second metal layer 304 may operatively function as the first electrode and second electrode of a resultant capacitor, with the dielectric layer 312 functioning as a dielectric medium of the capacitor. Further, the first metal layer 302 and metal layer 304 can extend over a top surface of the substrate 202, which allows a number of via structures to connect to the first metal layer 302 and second metal layer 304, respectively. The metal layers may be deposited using any of various depositing techniques such as, for example, chemical vapor deposition (CVD), physical vapor deposition (PVD), electrolytic plating, electroless plating processes, or the like. The dielectric layer may be deposited using any of various depositing techniques such as, for example, chemical vapor deposition (CVD), physical vapor deposition (PVD), atomic layer deposition (ALD), or the like.

Referring next to operation 3006, at least one first via structure and one second via structure are formed to electrically connect to the first metal layer and second metal layer, respectively. In various embodiments, the first via structure (e.g., 252) and second via structure (e.g., 254) may form a via group, as above discussed in one of the implementations (e.g., 200, 1000, 1600, 2200, 2800). For example, the via group (e.g., 250, 1050, 1650, 2250, 2850, 2860) including the first via structure and the second via structure may be interposed between the first trench and the second trench along a first lateral direction (e.g., the lengthwise direction of one of the first or second trench). Further, in various embodiments of the present disclosure, the first via structure 252 and the second via structure 254 can be disposed immediately adjacent to each other along a second lateral direction (e.g., the lengthwise direction of the other one of the first or second trench). The via structures may be formed by etching the first metal layer, the dielectric layer, and/or the second metal layer, followed by deposition using any of various depositing techniques such as, for example, chemical vapor deposition (CVD), physical vapor deposition (PVD), electrolytic plating, electroless plating processes, or the like.

Referring then to operation 3008, at least one first metal routing and one second metal routing are formed to electrically connect to the first via structure and second via structure, respectively. In various embodiments, the first metal routing (e.g., 710, 910, 1310, 1510, 1910, 2110, 2510, 2710) and second metal routing (e.g., 720, 920, 1320, 1520, 1920, 2120, 2520, 2720) can be arranged in parallel with each other. Further, the first and second metal routings can both extend along a lateral direction tilted from any of the first lateral direction or second lateral direction, along the first lateral direction, or along the second lateral direction. The metal routings may be formed by etching a dielectric material above the via structures (e.g., an interlayer dielectric or intermetal dielectric), followed by deposition using any of various depositing techniques such as, for example, chemical vapor deposition (CVD), physical vapor deposition (PVD), electrolytic plating, electroless plating processes, or the like.

In one aspect of the present disclosure, a semiconductor device is disclosed. The semiconductor device includes a plurality of first arrays, each of the plurality of first arrays including a plurality of first trenches that vertically extend into a substrate and laterally extend along a first direction. The semiconductor device includes a plurality of second arrays, each of the plurality of second arrays including a plurality of second trenches that vertically extend into the substrate and laterally extend along a second direction perpendicular to the first direction. The semiconductor device includes a plurality of via groups, each of the plurality of via groups including a plurality of via structures that have respectively different heights and are arranged laterally close to each other.

In another aspect of the present disclosure, a semiconductor device is disclosed. The semiconductor device includes a substrate including a first trench that extends along a first lateral direction and a second trench that extends along a second lateral direction; a first metal layer filling each of the first and second trenches; a second metal layer filling each of the first and second trenches, and disposed above and electrically isolated from the first metal layer; a first via structure in electrical contact with the first metal layer; and a second via structure in electrical contact with the second metal layer. When viewed from the top, the first via structure and the second via structure are interposed between the first trench and the second trench along the first lateral direction. The first via structure and the second via structure are disposed immediately adjacent to each other along the second lateral direction.

In yet another aspect of the present disclosure, a method for fabricating semiconductor devices is disclosed. The method includes forming a first trench and a second trench in a semiconductor substrate, wherein the first trench extends in a first lateral direction and the second trench extends in a second lateral direction perpendicular to the first lateral direction. The method includes depositing a first metal layer over the first and second trenches, a dielectric layer over the first metal layer, and a second metal layer over the dielectric layer. The method includes forming a first via structure in electrical contact with the first metal layer. The method includes forming a second via structure in electrical contact with the second metal layer. When viewed from the top, the first via structure and the second via structure are interposed between the first trench and the second trench along the first lateral direction. The first via structure and the second via structure are disposed immediately adjacent to each other along the second lateral direction.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of first arrays, each of the plurality of first arrays including a plurality of first trenches that vertically extend into a substrate and laterally extend along a first direction;
a plurality of second arrays, each of the plurality of second arrays including a plurality of second trenches that vertically extend into the substrate and laterally extend along a second direction perpendicular to the first direction; and
a plurality of via groups, each of the plurality of via groups including a plurality of via structures that have respectively different heights and are arranged laterally close to each other, each of the plurality of via groups is laterally disposed between two arrays.

2. The semiconductor device of claim 1, wherein each of the plurality of via groups is laterally disposed between a corresponding one of the first arrays and a corresponding one of the second arrays.

3. The semiconductor device of claim 1, wherein at least a first one and a second one of the plurality of via groups are arranged along the first direction, and wherein the respective via structures of the first via group and the respective via structures of the second via group are also arranged along the first direction.

4. The semiconductor device of claim 3, wherein the first via group is interposed between a first one of the first arrays and a first one of the second arrays along the second direction, and the second via group is interposed between a second one of the first arrays and a second one of the second arrays along the second direction.

5. The semiconductor device of claim 1, wherein at least a first one and a second one of the plurality of via groups are arranged along the second direction, and wherein the respective via structures of the first via group and the respective via structures of the second via group are also arranged along the second direction.

6. The semiconductor device of claim 5, wherein the first via group is interposed between a first one of the first arrays and a first one of the second arrays along the first direction, and the second via group is interposed between a second one of the first arrays and a second one of the second arrays along the first direction.

7. The semiconductor device of claim 1, wherein at least a first one and a second one of the plurality of via groups are arranged along the first direction, and at least a third one and a fourth one of the plurality of via groups are arranged along the second direction, and wherein the respective via structures of the first via group and the respective via structures of the second via group are also arranged along the first direction, and the respective via structures of the third via group and the respective via structures of the fourth via group are also arranged along the second direction.

8. The semiconductor device of claim 7, wherein the first via group is interposed between a first one of the first arrays and a first one of the second arrays along the second direction, the second via group is interposed between a second one of the first arrays and a second one of the second arrays along the second direction, the third via group is interposed between a third one of the first arrays and a third one of the second arrays along the first direction, and the fourth via group is interposed between a fourth one of the first arrays and a fourth one of the second arrays along the first direction.

9. The semiconductor device of claim 1, wherein the plurality of via structures, in each of the via groups, are connected to different metal layers of a corresponding pair of the first arrays and the second arrays, respectively.

10. The semiconductor device of claim 9, wherein a difference between any successive ones of the heights is about equal to a thickness of the metal layers.

11. The semiconductor device of claim 1, further comprising:
    a plurality of first metal routings each configured to connect a first subset of the via structures in a first one of the via groups to a first subset of the via structures in a second one of the via groups; and
    a plurality of second metal routings each configured to connect a second subset of the via structures in the first via group to a second subset of the via structures in the second via group.

12. The semiconductor device of claim 11, wherein the plurality of first metal routing and the plurality of second metal routings all laterally extend along a direction tilted from each of the first direction and second direction.

13. The semiconductor device of claim 11, wherein the plurality of first metal routing and the plurality of second metal routings all laterally extend along the first direction.

14. The semiconductor device of claim 11, wherein the plurality of first metal routing and the plurality of second metal routings all laterally extend along the second direction.

15. The semiconductor device of claim 1, wherein the plurality of via structures in each via group are arranged over a single staircase structure, each stair of the staircase structure having a stair height determined according to a thickness of a corresponding metal layer or dielectric layer.

16. A semiconductor device, comprising:
    a substrate including a first trench that extends along a first lateral direction and a second trench that extends along a second lateral direction;

a first metal layer filling each of the first and second trenches;
    a second metal layer filling each of the first and second trenches, and disposed above and electrically isolated from the first metal layer;
    a first via structure in electrical contact with the first metal layer; and
    a second via structure in electrical contact with the second metal layer;
    wherein, when viewed from the top, the first via structure and the second via structure are interposed between the first trench and the second trench along the first lateral direction; and
    wherein the first via structure and the second via structure are disposed immediately adjacent to each other along the second lateral direction.

17. The semiconductor device of claim 16, wherein the first via structure is electrically coupled to a first voltage, and the second via structure is electrically coupled to a second voltage different from the first voltage.

18. The semiconductor device of claim 16, further comprising:
    a first metal routing electrically coupled to the first via structure; and
    a second metal routing electrically coupled to the second via structure;
    wherein the first and second metal routings both extend along a lateral direction tilted from each of the first lateral direction and the second lateral direction, along the first lateral direction, or along the second lateral direction.

19. The semiconductor device of claim 16, wherein the first metal layer and the second metal layer each comprise titanium nitride, titanium, tantalum nitride, tantalum, copper, or aluminum.

20. The semiconductor device of claim 16, further comprising a dielectric layer disposed between the first metal layer and the second metal layer, the dielectric layer comprising a high-k dielectric.

\* \* \* \* \*